(12) United States Patent
Stumpf

(10) Patent No.: US 12,410,517 B2
(45) Date of Patent: Sep. 9, 2025

(54) DIVERTLESS GAS-DOSING

(71) Applicant: Lam Research Corporation, Fremont, CA (US)

(72) Inventor: John Folden Stumpf, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 357 days.

(21) Appl. No.: 17/920,578

(22) PCT Filed: Apr. 15, 2021

(86) PCT No.: PCT/US2021/027555
§ 371 (c)(1),
(2) Date: Oct. 21, 2022

(87) PCT Pub. No.: WO2021/216352
PCT Pub. Date: Oct. 28, 2021

(65) Prior Publication Data
US 2023/0167550 A1 Jun. 1, 2023

Related U.S. Application Data

(60) Provisional application No. 62/706,328, filed on Aug. 10, 2020, provisional application No. 63/015,243, filed on Apr. 24, 2020.

(51) Int. Cl.
*C23C 16/455* (2006.01)
*G01F 1/50* (2006.01)
(52) U.S. Cl.
CPC .. *C23C 16/45557* (2013.01); *C23C 16/45561* (2013.01); *G01F 1/50* (2013.01)
(58) Field of Classification Search
CPC ........ C23C 16/45557; C23C 16/45544; C23C 16/42; C23C 16/45561
See application file for complete search history.

(56) References Cited

U.S. PATENT DOCUMENTS

2007/0042508 A1 2/2007 Shajii et al.
2009/0266296 A1* 10/2009 Tachibana ........... C23C 16/4485
118/715
(Continued)

FOREIGN PATENT DOCUMENTS

CN 115443348 12/2022
JP 4964484 4/2012
(Continued)

OTHER PUBLICATIONS

International Application Serial No. PCT/US2021/027555, International Search Report mailed Aug. 13, 2021, 4 pgs.
(Continued)

*Primary Examiner* — Joseph A Miller, Jr.
(74) *Attorney, Agent, or Firm* — Schwegman Lundberg & Woessner, P.A.

(57) ABSTRACT

Various embodiments include systems and apparatuses for divertless dosing of process gases, including divertless dosing of precursor gases in deposition systems. In one example, the disclosed subject matter is a divertless, pressure-based gas-dosing system that includes a process gas inlet coupled to an inlet valve, a flow controller coupled to be downstream of the inlet valve, and a line charge-volume (LCV) coupled to be downstream of the inlet valve and the flow controller. The LCV is to receive an initial single-dose of the process gas. A pressure sensor is coupled to the LCV to determine a pressure level within the LCV and an outlet valve is pneumatically coupled to be downstream of the LCV. The outlet valve is to be coupled pneumatically on a downstream side of the outlet valve to a process chamber. Other systems, apparatuses, and methods are disclosed.

20 Claims, 12 Drawing Sheets

(56) References Cited

U.S. PATENT DOCUMENTS

| | | | | |
|---|---|---|---|---|
| 2013/0186340 A1* | 7/2013 | Omori | ............... | C23C 16/45563 |
| | | | | 118/728 |
| 2015/0275366 A1* | 10/2015 | Fukushima | ......... | C23C 16/4412 |
| | | | | 438/778 |
| 2016/0047039 A1* | 2/2016 | Hirose | .............. | C23C 16/45527 |
| | | | | 118/715 |
| 2017/0167026 A1* | 6/2017 | Nakada | ..................... | G01F 3/36 |
| 2019/0119813 A1 | 4/2019 | Khan et al. | | |
| 2020/0126758 A1 | 4/2020 | Leeser | | |

FOREIGN PATENT DOCUMENTS

| | | |
|---|---|---|
| JP | 2012184481 | 9/2012 |
| JP | 2015191957 | 11/2015 |
| JP | 2017112159 | 6/2017 |
| JP | 2017112159 A | 6/2017 |
| JP | 2020059910 | 4/2020 |
| JP | 2023523921 | 6/2023 |
| KR | 20190006911 | 1/2019 |
| KR | 20190006911 A | 1/2019 |
| WO | 2014065233 | 5/2014 |
| WO | 2021216352 | 10/2021 |
| WO | WO-2021216352 A1 | 10/2021 |

OTHER PUBLICATIONS

International Application Serial No. PCT/US2021/027555, Written Opinion mailed Aug. 13, 2021, 7 pgs.

"International Application Serial No. PCT US2021 027555, International Preliminary Report on Patentability mailed Nov. 3, 2022", 9 pgs.

"Japanese Application Serial No. 2022-564144, Voluntary Amendment filed Apr. 11, 2024", w English claims, 25 pgs.

"Korean Application Serial No. 10-2022-7041167, Voluntary Amendment filed Apr. 12, 2024", w English claims, 8 pgs.

"Japanese Application Serial No. 2022-564144, Notification of Reasons for Refusal mailed Jun. 10, 2025", w English translation, 6 pgs.

\* cited by examiner

DIVERTLESS GAS-DOSING

CLAIM OF PRIORITY

This patent application is a U.S. National Stage Filing under 35 U.S.C. 371 from International Application No. PCT/US2021/027555, filed on Apr. 15, 2021, and published as WO 2021/216352 A1 on Oct. 28, 2021, which claims priority to U.S. Provisional Application Ser. No. 63/015,243, entitled, "DIVERTLESS DOSING," filed 24 Apr. 2020; and further claims priority to U.S. Provisional Application Ser. No. 62/706,328, also entitled, "DIVERTLESS DOSING," filed 10 Aug. 2020; the disclosures of each of which are incorporated herein by reference in their entireties.

TECHNOLOGY FIELD

The disclosed subject matter is generally related to the field of depositing films on substrates. More specifically, in various embodiments the disclosed subject matter is related to delivering one or more precursor gases (e.g., one or more doses) to a process chamber with less precursor gas waste and lower variability in the dose quantity.

BACKGROUND

In a typical atomic-layer deposition (ALD) process, individual precursor gases are pulsed onto a surface of a substrate in a sequential manner, without mixing the precursors in the gas phase. Each individual precursor reacts with a surface of the substrate to form an atomic layer of a film in a way that only one layer is formed at a time. A surface reaction occurs such that the reaction is complete and permits no more than one layer at a time to be deposited. This surface reaction occurs no matter how many molecules are applied to the surface in an overdosing mode. The films are built up by introducing short bursts of variability gases in rapid cycles. During ALD processing using a liquid delivery system, it is necessary to keep an established flow of the liquid precursor in a vapor phase. In order to keep the flow active, the flow must be diverted to a foreline of the ALD chamber when the liquid precursor is not needed in the deposition process.

The information described in this section is provided to offer the skilled artisan a context for the following disclosed subject matter and should not be considered as admitted prior art.

SUMMARY

In various embodiments, a divertless, gas-dosing system is disclosed. The divertless, gas-dosing system includes a process gas inlet pneumatically coupled to an inlet valve, a flow controller pneumatically coupled to the inlet valve, and a line charge-volume (LCV) pneumatically coupled to be downstream of the inlet valve and the flow controller. The LCV is to receive an initial single-dose of a process gas. A pressure sensor is coupled to the LCV to determine a pressure level within the LCV. An outlet valve is pneumatically coupled to be downstream of the LCV. The outlet valve is arranged to be coupled pneumatically to a process chamber on a downstream side of the outlet valve. The flow controller is to control a flow of the process gas to the process chamber independently of the inlet valve and substantially to maintain the flow at a pre-determined set point when the outlet valve is opened. The divertless, gas-dosing system is time independent with regard to a magnitude of the initial single-dose of the process gas.

In various embodiments, an apparatus to supply precursor gas is disclosed. The apparatus includes a precursor gas inlet pneumatically coupled to an inlet valve, a flow controller pneumatically coupled to be downstream of the inlet valve, and a line charge-volume (LCV) pneumatically coupled to be downstream of the flow controller. The LCV is arranged to be charged with an initial single-dose of the precursor gas. A pressure sensor is coupled to the LCV to determine a pressure level within the LCV. The initial single-dose of the precursor gas is to be determined based on a pressure level within the LCV. An outlet valve is pneumatically coupled to be downstream of the LCV. The outlet valve is arranged to be coupled pneumatically on a downstream side of the outlet valve to a process chamber. The outlet valve is further arranged to be opened to release the initial single-dose of the precursor gas to the process chamber after the pressure level of the LCV reaches a predetermined value. The flow controller is to control a flow of the precursor gas to the process chamber independently of the inlet valve and substantially to maintain the flow at a pre-determined set point when the outlet valve is opened. The apparatus is time independent with regard to a magnitude of the initial single-dose of the process gas.

In various embodiments, a divertless, gas-dosing system is disclosed. The divertless, gas-dosing system includes a first process gas inlet pneumatically coupled to a first inlet valve to receive a first process gas, a second process gas inlet pneumatically coupled to a second inlet valve to receive a second process gas, a first flow controller and a second flow controller pneumatically coupled separately to be downstream of the first inlet valve and the second inlet valve, respectively, and at least one, line charge-volume (LCV) pneumatically coupled to be downstream of first flow controller and the second flow controller. The at least one LCV is to receive an initial single-dose of at least one of a mixture of the first process gas and the second process gas and separate initial single-doses of the first process gas and the second process gas. At least one pressure sensor is coupled separately to respective ones of the at least one LCV to determine a pressure level within each of the at least one LCVs. An outlet valve is pneumatically coupled to be downstream of the at least one LCV. The outlet valve is to be coupled pneumatically on a downstream side of the outlet valve to a process chamber. The divertless, gas-dosing system is time independent with regard to a magnitude of the initial single-dose of the process gas.

DETAILED DESCRIPTION

Figure 1A:
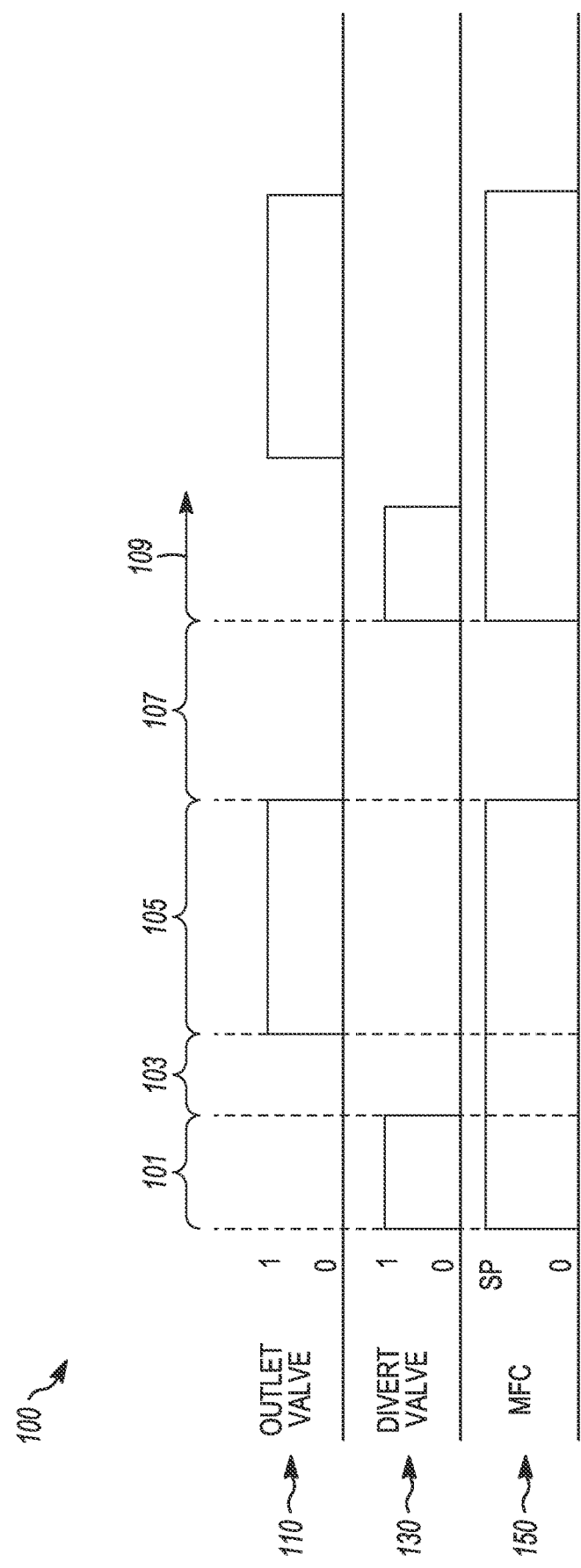
FIG. 1A shows a timing chart for a dose-divert system of the prior art.

The description that follows includes illustrative examples, devices, and apparatuses that embody various aspects of the disclosed subject matter. In the following description, for purposes of explanation, numerous specific details are set forth in order to provide an understanding of various embodiments of the inventive subject matter. It will be evident however, to those of ordinary skill in the art, that various embodiments of the disclosed subject matter may be practiced without these specific details. Further, well-known structures, materials, and techniques have not been shown in detail, so as not to obscure the various illustrated embodiments.

As is known in the relevant art, a chemical-vapor deposition (CVD) process in general, or an atomic-layer deposition (ALD) process specifically, exposes a workpiece (e.g., a substrate, such as a semiconductor wafer) to multiple applications of chemical precursor gases (subsequent applications of precursor gas "A"), and/or alternating chemical precursor gases (e.g., precursor gases "A" and "B").

During an example of an ALD process using two precursor gases, the first precursor, "A," forms a monolayer of film on the substrate. The second precursor, "B," chemically reacts with the monolayer film of "A" to form a third desired compound, "C," monolayer film on the substrate. To form a usable compound film "C" on the substrate, the substrate is exposed to hundreds, or even thousands, of alternating "A" and "B" precursor gas applications. To increase productivity of a semiconductor ALD deposition tool, a length of time for at least one of the precursor steps, "A" or "B" in this example, must be reduced or minimized.

As outlined in more detail below, various embodiments of the disclosed subject matter make physical and operational changes to the gas (e.g., precursor gas) delivery hardware and process sequences in order to reduce ALD process time, reduce process variability, and eliminate waste of specialty process gases, thereby reducing the cost of operation.

For example, thermally-based based mass-flow controllers (MFCs) can often take about 500 msec to about 1000 msec to reach a given flow set-point. Currently, during the ALD process cycle, a precursor gas is run though the MFC for approximately one to two seconds into a gas diversion element (a "divert") before switching the gas path from the divert to delivery of the gas to the process chamber by opening an outlet valve to the chamber. This procedure is currently followed so that the MFC is at a steady-state commanded-flow level to increase or maximize the flow delivered to the chamber, thereby reducing or minimizing the time for each step in the ALD process. Further, the speed and variability of the ramp-up of the gas to reach a given set-point of the MFC can significantly affect the mass of gas delivered to the chamber.

However, delivering the precursors to the divert, thus bypassing the process chamber, wastes the precursor gas. The wasted precursor gas thus increases the cost-of-ownership (COO) of operating the semiconductor tool for ALD. In some cases, and as explained in more detail below to emphasize the significant advantages of the disclosed subject matter over the current art, an additional step in the process includes first closing the divert valve while the MFC is flowing and then wait a period of time before opening the outlet valve to the process chamber. This procedure pressurizes the line between the MFC and the chamber outlet valve; the pressurization procedure is frequently referred to as a "Line Charge-Volume" (LCV) operation. An LCV "chamber" can be designed to include a desired volume by, for example, varying an interior diameter of the gas line and/or increasing the length of the gas line. The LCV can also be increased by adding an accumulator chamber. By pressurizing the LCV downstream of the MFC and then opening the outlet valve, a pulse (or dose) of gas at a higher flowrate and pressure than the steady-state MFC flowrate can be delivered to the process chamber, further speeding up the ALD process. The effect of the increased flowrate and pressure of the pulsed dose is that the mole fraction of the precursor gas is increased early in the process step. The increased mole fraction early in the process step increases diffusion of the respective precursor gas or gases into, for example, complex vertical structures such as word-lines, which occurs more quickly thereby reducing the overall precursor step time. Accomplishing the increased mole fraction is performed currently by sequencing various valves on a set schedule or recipe. The current procedure is shown with reference to FIG. 1A.

FIG. 1A shows a timing chart 100 for a dose-divert system of the prior art. An example of a dose-divert system is described below with reference to FIG. 1B. FIG. 1A shows separate diagrams for outlet-valve timing signals 110, divert-valve timing signals 130, and MFC timing signals 150. Each of the outlet-valve timing signals 110 and the divert-valve timing signals 130 indicate a "0" and "1" for closed positions and open positions of the valves, respectively. The MFC timing signals 150 indicate a closed position "0" and a set-point value "SP," respectively.

During a first time period 101, which can be considered as an MFC stabilization period, the outlet-valve timing signal 110 is at "0." Consequently, the outlet valve is in a closed position, while the divert-valve timing signal 130 is at "1" and the MFC timing signal 150 is at the set-point value, "SP," mentioned above. Therefore, the divert valve and the MFC are at an open position and a set-point position, respectively.

During a second time period 103, which can be considered as a line charging-period in which the two non-MFC valves (i.e., the divert valve and the outlet valve) are closed. Therefore, the outlet valve remains closed, the divert valve is now closed, while the MFC remains at the set-point position. During the third time period 105, which can be considered as a precursor-gas flow-to-chamber period) in which the outlet valve is open such that the precursor gas flows into the process chamber, the outlet valve is now open and the divert valve is closed, while the MFC remains at the set-point position. During the fourth time period 107, constituting a purge period, the outlet valve, the divert valve, and the MFC are all closed. The time period 109 begins a new, repeated series of cycles and thus indicates a repeat of the first four time periods 101, 103, 105, 107, just described.

Figure 1B:
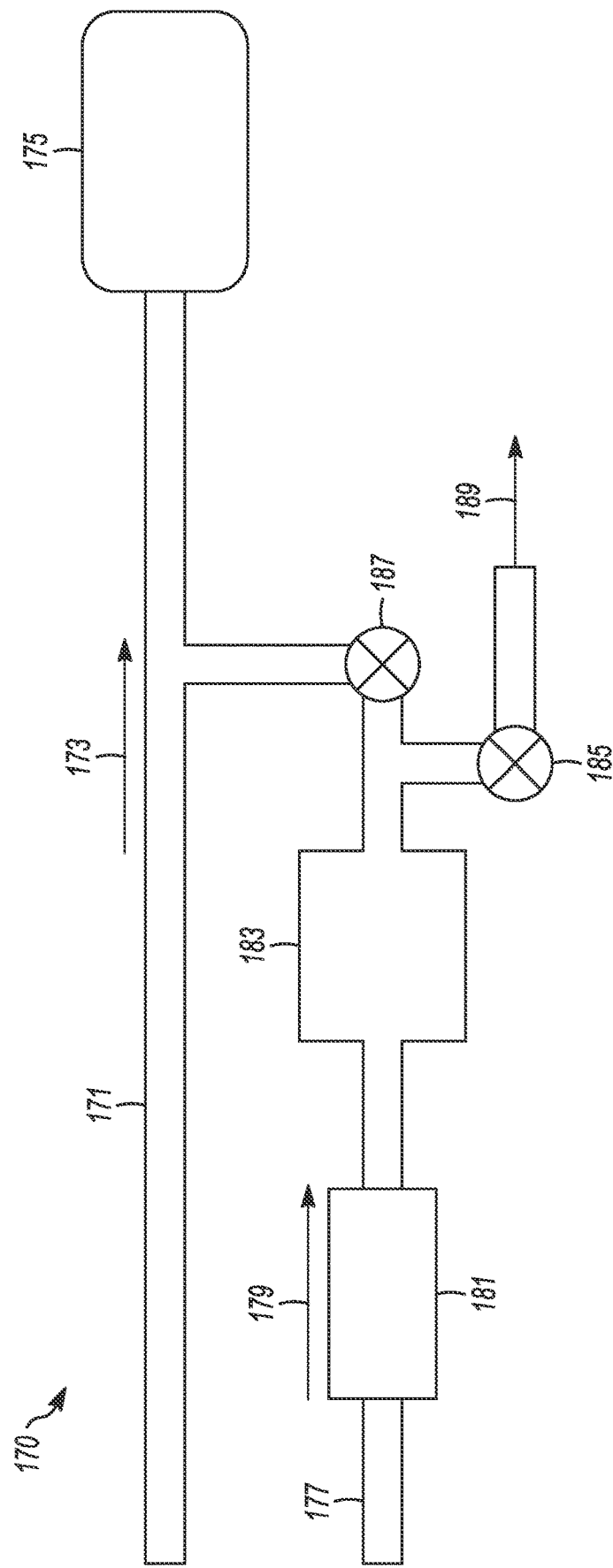
FIG. 1B shows a dose-divert system of the prior art.

With reference now to FIG. 1B, a dose-divert system 170 of the prior art is shown. FIG. 1B includes an inert gas line 171, a flow controller 181 (e.g., an MFC), a charge volume 183, a divert valve 185, and an outlet valve coupled to a process chamber 175.

If an inert gas flow (e.g., nitrogen ($N_2$) or argon (Ar)) is used, the inert gas flows in a direction 173 in the inert gas line 171 toward the process chamber 175. If the flow controller 181 is open (e.g., at a setting of SP), precursor gas is flowing in a direction 179 toward the charge volume 183. If the divert valve 185 is open, the precursor gas flows through the divert valve 185 and is diverted to a foreline (e.g., to facility waste through vacuum pumps or is otherwise diverted around the process chamber 175 and not into the process chamber). If the flow controller 181 is open, or there is a volume of the precursor gas that is within the charge volume 183, once the outlet valve 187 is opened, the precursor gas flows into the process chamber 175.

With continuing reference to FIG. 1B, and now concurrent reference back to FIG. 1A, a person of ordinary skill in the art will recognize how the dose-divert system 170 functions. In a specific example, during the first time period 101 (the MFC stabilization period), the MFC (e.g., the flow controller 181) is flowing precursor gas for two seconds with a signal set at SP for precursor gas flow for the divert valve (e.g., the divert valve 185) to reach steady-state. During the second time period 103 (the line charging period), the MFC remains at SP flow with both the divert valve and the outlet valve (e.g., the outlet valve 187) closed (i.e., the signals sent to the divert valve and the outlet valve are both at "0") to build pressure in the LCV (e.g., the charge volume 183), downstream of the MFC. During the third time period 105 (the precursor-gas flow-to-chamber period), the outlet valve open is open for, for example, five seconds, delivering gas to the chamber (e.g., the process chamber 175). During the fourth time period 107 (the purge cycle), the MFC, the divert valve, and the outlet valve are all closed for a purge cycle to clear the precursor gas.

Figure 2:
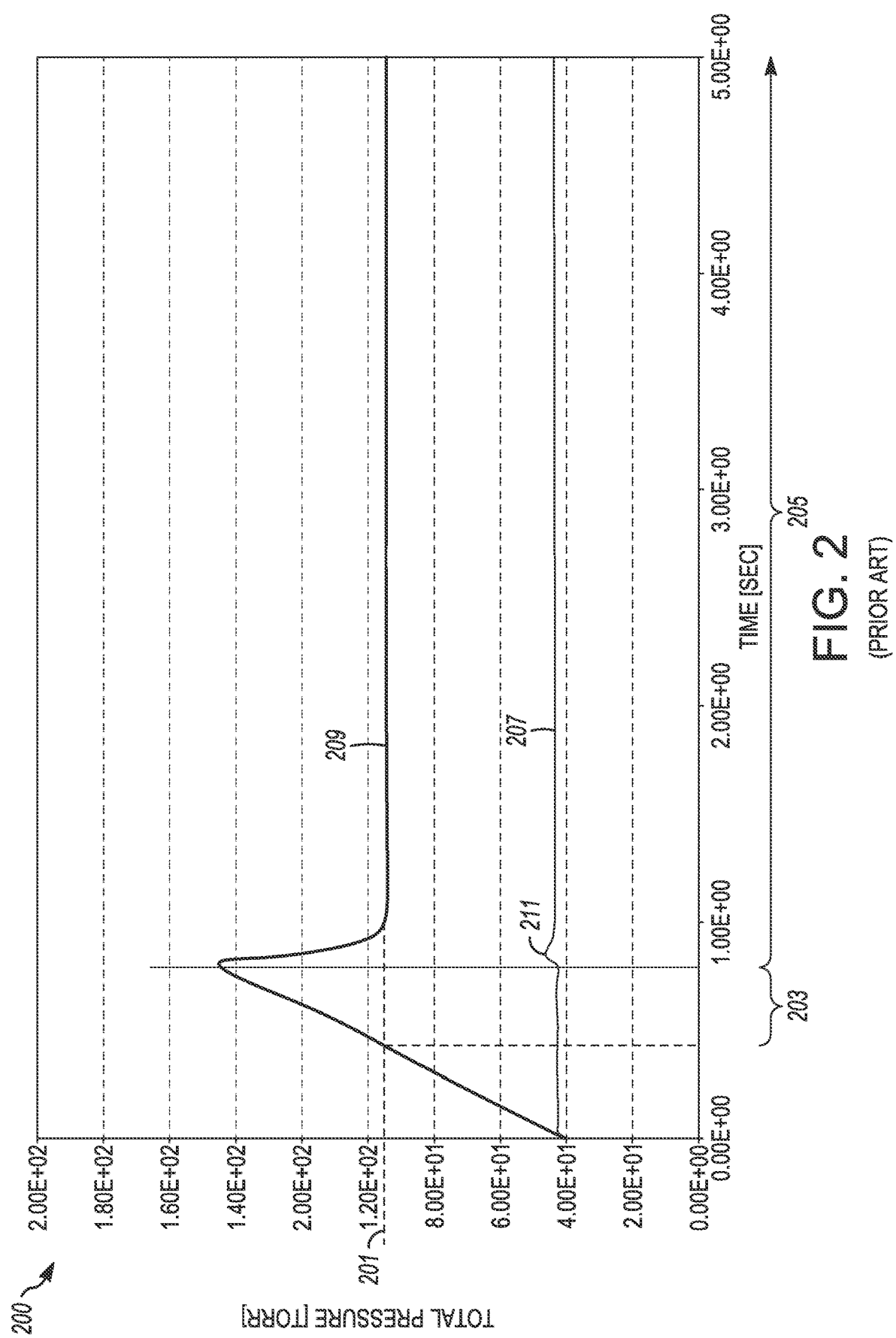
FIG. 2 shows a line charge-volume (LCV) graph indicating pressure as a function of time of the dose-divert system of FIG. 1B of the prior art.

Referring now to FIG. 2, a line charge-volume (LCV) graph 200 indicating pressure as a function of time of the dose-divert system 170 of FIG. 1B of the prior art is shown. With continuing reference to FIG. 1B, FIG. 2 indicates a level of delivery pressure 201 (i.e., to the process chamber 175), a level of pressure inside the LCV 209 (e.g., the charge volume 183 of FIG. 1B), an initial pressure and flow pulse 211 of the precursor gas just prior to delivery of the precursor gas to the process chamber (e.g., the process chamber 175 of FIG. 1B), and a level of steady-state pressure 207, also just prior to the process chamber. The LCV graph 200 also indicates a first time period 203 where pressure in the LCV is above the steady-state delivery pressure 201, which occurs just before the second time period 205 when the outlet valve (e.g., the outlet valve 187 of FIG. 1B) is opened and remains open.

ALD sequences that make use of the charge volume 183, as shown and described with reference to FIG. 1B, allow the delivery time of the precursor gas to the process chamber 175 to be shortened. Further, the initial pressure and flow pulse 211 of the precursor gas is also delivered to the chamber, both of which speed up saturation of the substrate surface with the precursor. Both of these effects reduce the overall ALD cycle time. A total mass of the precursor gas delivered to the process chamber is described by the following equation:

$$m_{total} = t_{>ss} \cdot \dot{m} + t_{ov} \cdot \dot{m} \quad (1)$$

where the total mass, $m_{total}$, of the precursor gas is equal to an amount of time, $t_{>ss}$, the valve flow-coefficient ($C_v$) is above the level of steady-state delivery pressure 201 times the mass flowrate, $\dot{m}$, of the precursor gas, which is added to the time, $t_{ov}$, the outlet valve 187 is open times the mass flowrate, $\dot{m}$.

However, in addition to losing precious precursor gases to the divert process as described with regard to the dose-divert system 170 of FIG. 1B, sequencing on a set schedule further leads to variability in pressures in the LCV. The variability in pressures relates directly to an amount of precursor gases that are delivered to the process chamber (since the precursor gases comprise a compressible material, unlike liquids). Moreover, unit-to-unit variability (e.g., from LCV-to-LCV charge) is due to volumetric differences, flowrate differences, valve flow-coefficient ($C_v$) differences, temperature differences, and other factors known to a person of ordinary skill in the art. Therefore, the amount of precursor gas delivered from cycle-to-cycle or time-to-time (e.g., one week to another) can also vary due to valve $C_v$ changes, temperature changes, flowrate drift, maintenance that can change the volume of the LCV due to fitting makeup, and other factors. The variability in the performance unit-to-unit (from one process chamber to another, one process station to another, or one tool to another), the cycle-to-cycle, and the time-to-time variabilities all directly affect the variability of deposition on a substrate undergoing an ALD process. The deposition variability can lead to die loss and even entire substrate loss.

Figure 3:
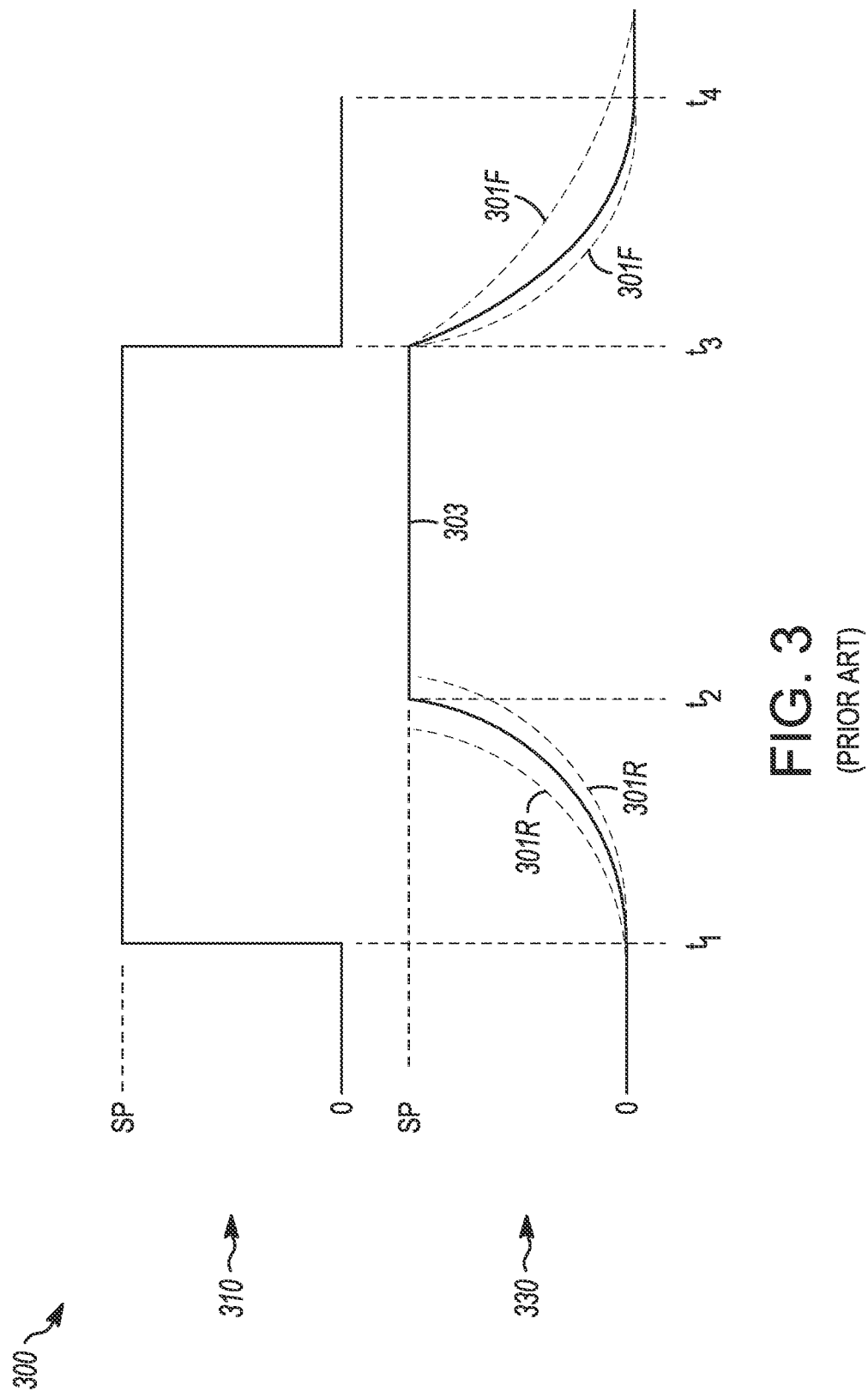
FIG. 3 shows a response variability and ramp speed chart of the prior art indicating possible large variations in a mass-flow controller (MFC) for a precursor-gas dose delivered to a process chamber; the chart of the MFC variations is typical of those used with the dose-divert system of the prior art as shown in FIG. 1B.

Further, flow controllers (e.g., the flow controller 181 of FIG. 1B), also have inherent response variabilities. FIG. 3 shows a response variability and ramp speed chart 300 of the prior art indicating possible large variations in a mass-flow controller (MFC) for a precursor-gas dose delivered to a process chamber (e.g., the process chamber 175 of FIG. 1B). The chart of the MFC variations is typical of those used with the dose-divert system of the prior art as shown in FIG. 1B.

The top graph 310 shows an idealized flow set-point command, where the MFC reacts instantly at time $t_1$ from fully closed to fully at the SP level. The MFC reacts similarly at time $t_3$ from fully at the set-point level SP to fully closed. The bottom graph 330 shows an actual response to command. At time $t_1$, a signal, "SP," is sent to the MFC to open to the set-point value, SP. However, the MFC is not fully at the level 303 of SP until about time $t_2$. Depending on an actual rise time (an open response time after receiving the SP signal) of the signal (e.g., how long it takes for the MFC to respond to the SP signal), the level 303 may actually be achieved before or after time $t_2$ depending on a variability 301R in the actual rise time. The variability 301R is indicative of a variability in the rise time for the MFC to become fully at SP depending on how quickly the MFC responds.

A similar situation occurs when the MFC receives a signal, "0," to close at time $t_3$. Depending on an actual fall time (a close response-time after receiving the signal 0) of the signal (e.g., how long it takes for the MFC to respond to the 0 signal), the MFC may not fully close from the level 303 until before time $t_4$ or after time $t_4$. Therefore, the full closure of the MFC may actually be achieved before or after time $t_4$ depending on a variability 301F in the actual fall time. The variability 301F is indicative of a variability in the fall time for the MFC to become fully closed, depending again on how quickly the MFC responds.

The variability described above with reference to FIG. 3 can vary significantly from one MFC to another, even when manufactured by the same company due to, for example, tolerances of components used to manufacture the MFC and an age of a particular MFC. An MFC will have an inherent flow-change time-constant based on a design of the MFC and that time constant can vary from time-to-time and unit-to-unit. Further, each type and brand of MFC may have a different response. Even each unit of the same type or same brand may have variability in ramp speed. Additionally, there can also be differences time-to-time within the same MFC.

Each of these variabilities can have a significant effect on the actual mass of precursor gas delivered to the process chamber. As noted above with regard to equation (1), the integral of the flowrate over time is the mass of flow delivered to the chamber. Consequently, for the same time and flow set-point, the mass delivered will change based on the shape and speed of the flow ramp up and ramp down as described with reference to FIG. 3. The dose-divert system 170 of FIG. 1B attempts to overcome these limitations by removing the variability of the ramp up of the MFC by flowing the precursor gas for a period of time into a divert (thereby wasting precursor gas) before filling the charge volume 183 or flowing to the process chamber 175.

In types of timed divertless gas-dosing systems that exist under the prior art, dosing may be accomplished by, for example.

Opening an inlet valve and commanding a set-point (SP) signal to be sent to an MFC located downstream of the inlet valve;

While an outlet valve downstream of an LCV is closed, pressure builds in the LCV;

At some pre-determined time, the outlet valve is opened to a process chamber located downstream of the LCV and outlet valve, respectively;

A flow pulse is then delivered to the process chamber—the MFC then controls a flowrate of the process gas to the initial set-point value for steady-state flow to the process chamber; and The MFC flow SP remains constant throughout the remainder of the process.

The foregoing examples are provided merely as examples to offer the skilled artisan a context for the following disclosed subject matter and should not be considered as admitted prior art.

However, in contrast to the precursor gas waste and variabilities described with reference to dose-divert systems and timed divertless gas-dosing systems of the prior art, the disclosed subject matter makes physical and operational changes to the gas delivery hardware and process sequences in order to reduce ALD process time, reduce process variability, and eliminate the waste of specialty precursor gases, thereby reducing a cost-of-operation (COO). For example, as described in more detail below, the disclosed subject matter removes the variability of the ramp up and ramp down of the MFC by filling an LCV to a predefined pressure, thereby allowing a variable time to fill the LCV. The variable fill time compensates for any ramp variability without the need to waste the precursor gas through the divert.

Moreover, in contrast to the timed divertless gas-dosing system of the prior art, the disclosed subject matter provides solutions to the following significant disadvantages of the prior-art systems as indicated below.

As discussed with reference to FIG. 3, above, a ramp speed of an MFC and timing differences of valves (e.g., the inlet valve and the outlet valve of the prior art) can lead to different final pressures in the LCV and, consequently, different magnitudes (e.g., volume and/or mass) of a delivered dose to the process chamber time-to-time and from unit-to-unit. Therefore, using the timed divertless gas-dosing system of the prior art, one process chamber may not produce the same on-substrate results (e.g., a quality of a film, a uniformity of a film, and/or a thickness of a film) from another chamber, or one chamber will produce a different process on one day versus another day.

There is no ability to change the time the pulse that would be delivered to the process chamber. For example, an optimal length-of-time to achieve a preferred flow pulse (e.g., an optimum LCV pressure) may be shorter or longer than the optimum time to deliver the pulse based on the other dose steps or purge steps.

When the outlet valve is opened the flow goes up (resulting in an increased dose), the increased flow is sensed by the MFC which will attempt to correct the increased flow and close the valve down; the MFC subsequently increase the flow when the pressure is equalized. This valve movement and response of the MFC can cause transient flow differences during and after the dose. These differences in transient response can vary from unit-to-unit and/or time-to-time.

Various embodiments described below provide solutions to each of the aforementioned disadvantages of the prior art, both in dose-divert systems and timed divertless gas-dosing system. Each of the advantages of the disclosed subject matter is described in more detail below.

As a further overview, various embodiments of the disclosed subject matter deliver ALD precursor-gas doses to a process chamber with less or no precursor-gas waste and lower variability of dose quantity as compared with, for example, the dose-divert system 170 of FIG. 1B. The reduced waste and lower variability is accomplished by filling a line charge-volume (LCV, such as a gas accumulator that may store certain volumes of a gas under pressure, as will be define in more detail below) with a precursor gas to a predefined pressure using an MFC, holding the pressure within the volume, holding the MFC control valve in a set position (e.g., the MFC is not controlling flow at this point of filling the LCV), and releasing the volume of gas into the process chamber. After the gas within the LCV is released into the process chamber, flow control of the precursor gas then reverts to the MFC. The various embodiments of the disclosed subject matter therefore eliminate any need for a divert, which as described above, is currently used to stabilize flow by flowing precursor gases to divert the gases initially from the process chamber. Consequently, precursor gas waste is eliminated. These concepts are described in various embodiments in more detail below.

Although the term "precursor gas" and "ALD sequence" or "ALD process" is used herein in order to more fully illustrate novel concepts of the disclosed subject matter, such limitations are not intended. For example, upon reading and understanding the disclosed subject matter, a person of ordinary skill in the art will recognize that the concepts described can be used with any process gas (e.g., other than or in addition to precursor gases) or with any process (e.g., other than ALD processes, including processes such as chemical vapor deposition (CVD) or physical vapor deposition (PVD) during gas-phase processes).

Figure 4A:
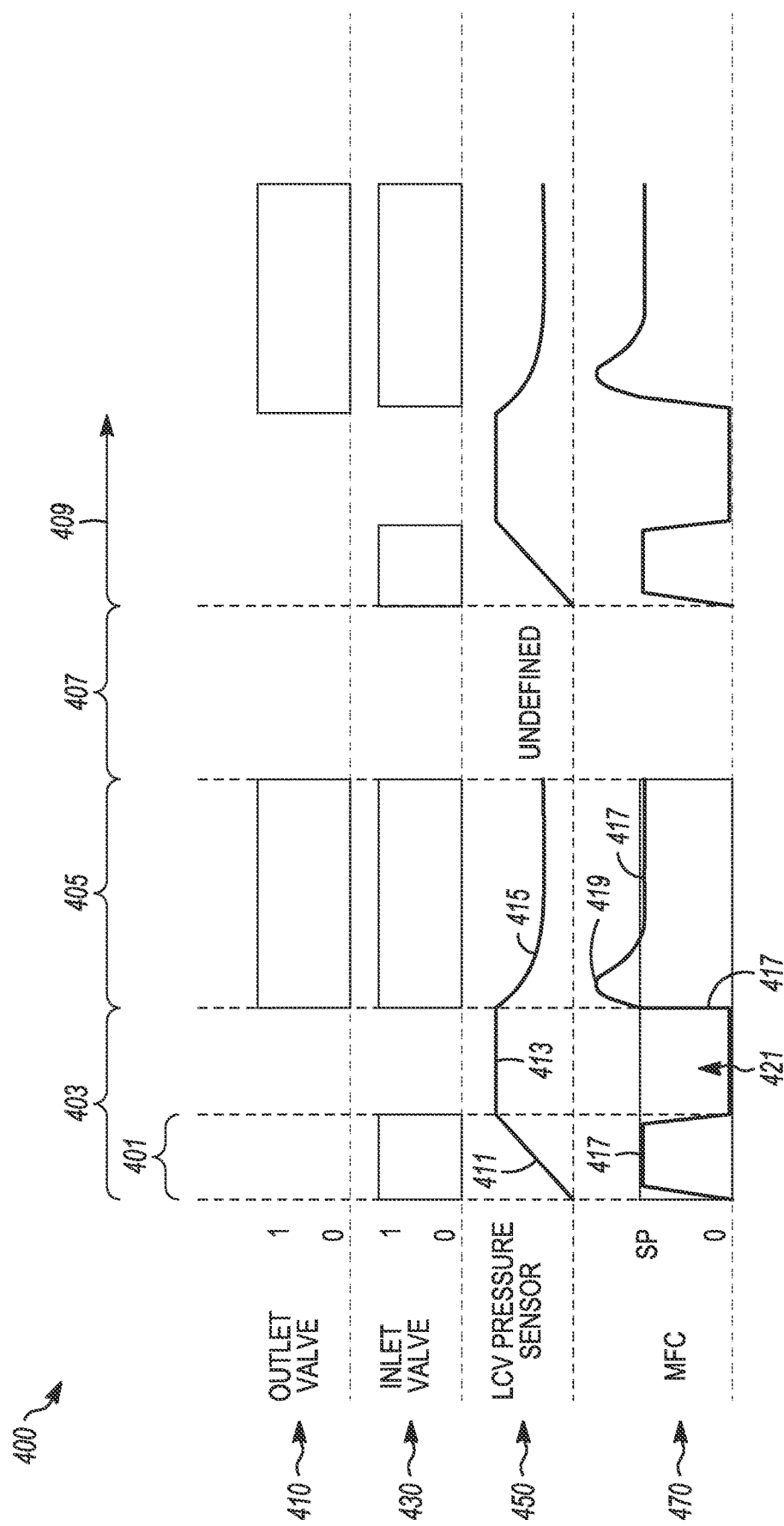
FIG. 4A shows an example of a process-sequence timing chart in accordance with various embodiments of the disclosed subject matter.
Figure 4B:
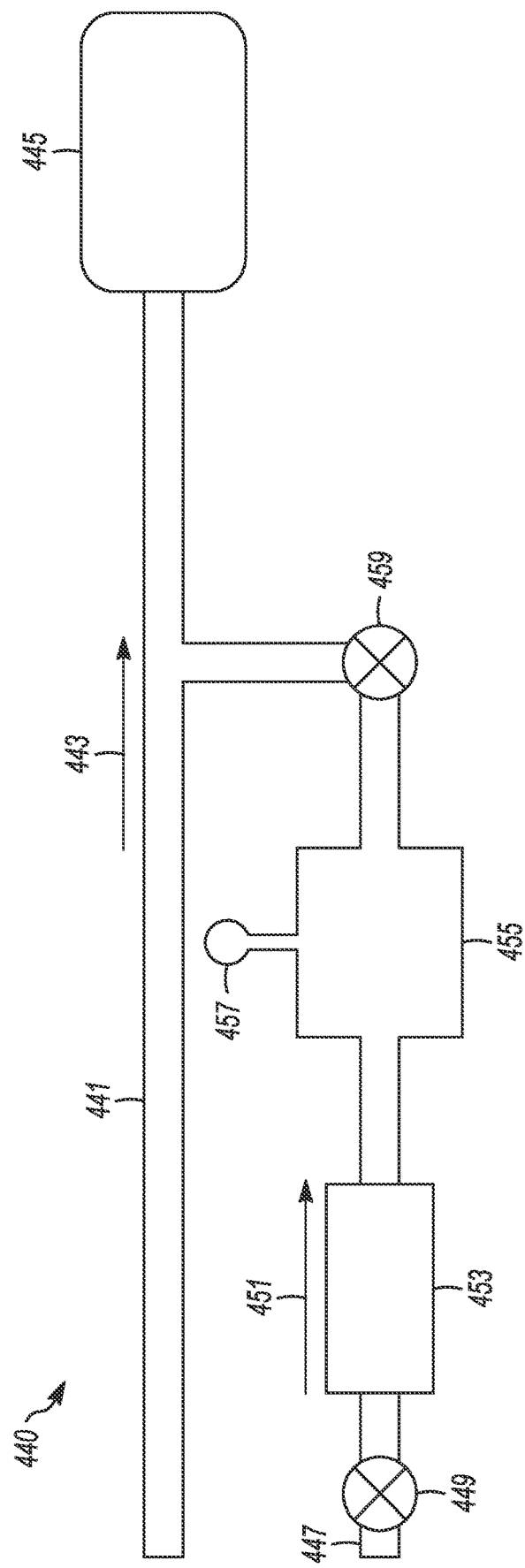
FIG. 4B shows an example of a divertless gas-dosing system in accordance with various embodiments of the disclosed subject matter.

FIG. 4A shows an example of a process-sequence timing chart 400 in accordance with various embodiments of the disclosed subject matter. FIG. 4B shows an example of a divertless gas-dosing system 440 in accordance with various embodiments of the disclosed subject matter. As will be recognizable to a person of ordinary skill in the art, upon reading and understanding the disclosed subject matter, the divertless gas-dosing system 440 does not rely on diverting (and consequently wasting) process gases that are to be used in a processing chamber.

With concurrent reference to both FIG. 4A and FIG. 4B, FIG. 4A is shown to include separate diagrams for outlet-valve timing signals 410, inlet-valve timing signals 430, LCV pressure-sensor signals 450, and MFC (e.g., a flow controller) timing signals 470. Each of the outlet-valve timing signals 410 and the inlet-valve timing signals 430 indicate a "0" and "1" for closed positions and open positions of the valves, respectively. The LCV pressure-sensor signals 450 show an actual pressure within the LCV. The MFC timing signals 470 indicate a closed position "0" and a set-point value "SP," respectively. FIG. 4B is shown to include a gas inlet 447, an inlet valve 449, a flow controller 453 (e.g., an MFC), a line charge-volume (LCV) 455, a pressure sensor 457 coupled to the LCV 455, and an outlet valve 459 coupled to a process chamber 445. If the inlet valve 449 and the flow controller 453 are open (e.g., with the flow controller 453 at a setting of SP), precursor gas is flowing in a direction 451 toward the LCV 455. If an inert gas flow (e.g., nitrogen ($N_2$) or argon (Ar)) is used, the inert gas flows in a direction 443 in an inert gas line 441 toward the process chamber 445. If the inert gas flow is not used, the inert gas line 441 may not be needed and therefore may be considered optional.

The LCV 455 may be formed from any number of ultra-high purity, non-permeable materials. For example, in one specific exemplary embodiment, the LCV 455 can be considered as a type of accumulator chamber, and may be formed from stainless steel (e.g., 316L stainless). In another specific exemplary embodiment, the LCV 455 may be formed from a variety of high-performance alloys (also known as superalloys), known in the art. These high-performance alloys include, for example, Inconel® (available from different sources including Inco Alloys international, Inc., Huntington, West Virginia, USA) or Hastelloy® (available from different sources including Haynes Stellite Company, Kokomo, Indiana, USA and Union Carbide Corporation, New York, New York, USA). Such a material, or the stainless-steel material or other ultra-high purity, non-permeable materials, may be electropolished to, for example, a surface roughness value of Ra less than about, for example, 0.5 µm or less than about 0.1 µm, or even less depending upon a given process. Further, a person of ordinary skill in the art, upon reading and understanding the disclosed subject matter, will recognize that the type of precursor gas employed may also influence the type of material from which the LCV 455 (and other components) are formed. Additionally, although the LCV 455 is shown as a separate volume, in certain embodiments, the LCV 455 may comprise a volume of a line carrying the process gases themselves. Although the LCV 455 may be designed to accommodate a variety of gas volumes, for example, for a given process or chamber size, in a specific exemplary embodiment the LCV 455 may have a volume from about 0.03 liters to about 0.3 liters. Upon reading and understanding the disclosed subject matter, a person of ordinary skill in the art will recognize a particular volume for the LCV 455 that may be needed.

With reference again to FIG. 4A and continuing reference to FIG. 4B, a first time period 401 includes a time period in which the inlet valve 449 is open. The flow controller 453 is also opened, providing an actual flow 417 of the precursor gas, arriving at the set-point, SP, value. A pressure level within the LCV 455 is monitored from received values of the LCV pressure-sensor signals 450 from the pressure sensor 457. The inlet valve 449 remains open while the pressure ramps 411 to a predetermined pressure 413. During this first time period 401, the LCV 455 is "charging" to a predetermined pressure level. Once the LCV 455 reaches the predetermined pressure (determining the end of the first time period 401), the inlet valve 449 is closed. With the inlet valve 449 closed, there is no flow coming into the flow controller 453. Therefore, the flow controller 453 may remain open or can be closed (closed as shown in the process-sequence timing chart 400 at the end of the first time period). As will be evident to a person of ordinary skill in the art, if the flow controller 453 remains open with no gas flow therethrough, any alarms that are set to indicate a "no-flow" condition may be overridden in, for example, an accompanying process recipe. In embodiments, the flow controller 453 itself would switch control modes—between controlling pressure and controlling flow. Consequently, when controlling pressure, an "incorrect flow signal" would not be generated. Such modes are described in more detail below.

A second time period 403 can be considered as a time in which the LCV 455 is fully charged to the predetermined pressure level. In a specific exemplary embodiment, a range of absolute pressures may be from, for example, between about 200 Torr to about 2000 Torr. However, the actual pressure may be dependent on a variety of factors such as a particular process or a process chamber volume. As noted above and as shown in the process-sequence timing chart 400, the flow controller 453 may remain open or can be closed anywhere within the latter portion 421 of the second time period 403 (the difference between the second time period 403 and the first time period 401).

During a third time period 405, in one embodiment, the inlet valve 449 is again opened and the flow controller 453, if closed, is reopened to the actual flow 417. The outlet valve 459 is opened, thereby releasing the precursor gas from the LCV 455 to flow into the process chamber 445. As the precursor gas is released from the LCV 455, a flow pulse 419 is delivered to the process chamber 445 and the pressure 415 decays to a steady-state level with the continuing flow into the process chamber being controlled by the MFC at the set-point value to the actual flow 417. However, various embodiments and differences to the operations described are explained in more detail below.

During a fourth time period 407, the system is purged. The entire cycle, including any or all of the prior time periods 401, 403, 405, 407, may be repeated in a repeated period 409. The pressure of the LCV 455 is undefined at this point. The same precursor gas or another precursor gas may be used during the repeated period 409.

In various embodiments, depending on whether the MFC is in a flow-control mode or based on a valve-position control mode, the valve may be set at a known position based on a valve-position feedback (i.e., a physically-measured opening distance (which may be based on, e.g., a capacitive position-sensor, an inductive position-sensor, or other type of position sensor) based on, for example, a previous MFC history or a calibration table. The MFC can have a map of a valve position versus flow rate and pressure. Therefore, this operation constitutes a type of open-loop control—the valve is opened to position "x," with an upstream pressure, $P_1$, and a downstream pressure, $P_2$. The flowrate may then be read from the calibration table. If the flow is choked flow (understandable to a skilled artisan), then only the upstream pressure, $P_1$, matters. Choked flow can be determined by the values of $P_1$ and $P_2$, which may be built into the calibration table. The calibration table can be created and revised at any time when the MFC is in flow control mode by comparing the calibration table to the actual flow signal. Therefore, when operating the divertless gas-dosing system 440 during the first time period 401, the valve may be driven as indicated in the calibration table to a position for the steady-state flow desired of the actual flow 417 of the precursor gas and left at that position until the flowrate steadies out after the flow pulse 419. In this embodiment, the inlet valve 449 is closed based on the LCV pressure but the control valve is not moved. Therefore, during the first time period 401, the MFC may operate in either a flow-control mode, or a valve-position control mode. After the first time period 401 and into the latter part of the second time period 403, the MFC may operate in the valve-position control mode. During the third time period 405, the MFC may transition from the valve-position control mode to the flow-control mode after the flow signal is stabilized (e.g., after the flow pulse 419; the mode change transition generally occurs only after steady-state flow is achieved). Further, the mode in which the MFC is used may not need to change (e.g., always in valve position control) each cycle. For example, the MFC valve position may be calibrated periodically (e.g., daily) by running the MFC in flow-control mode and then checking/revising the calibration of the valve position. This operation allows running the MFC in a faster valve-position control during process and then recalibrate when the module or process chamber is idle. The MFC could also be recalibrated using an inert gas and converting to the precursor gas in the MFC so as not to waste precursor gas.

Figure 4C:
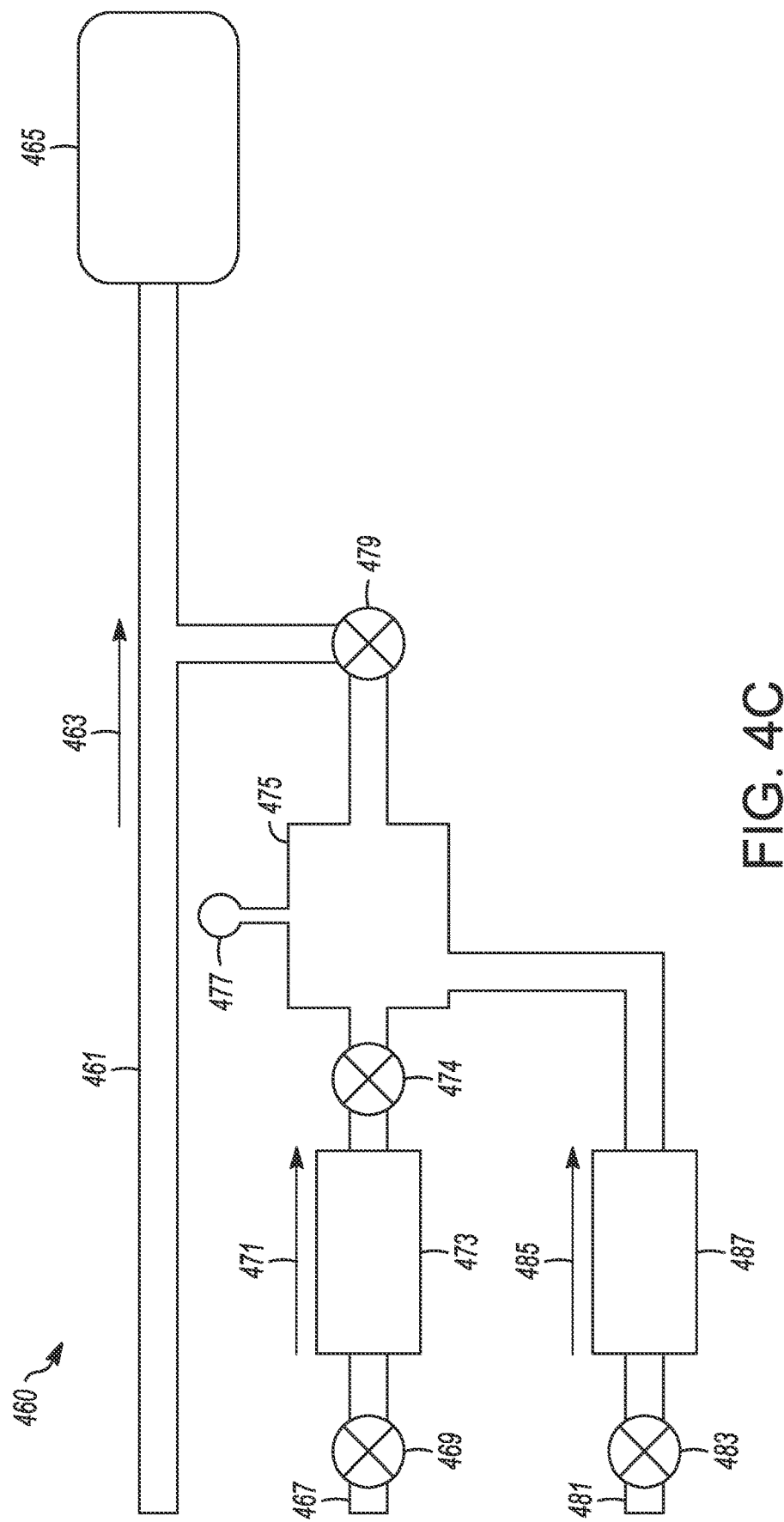
FIG. 4C shows another example of a divertless gas-dosing system in accordance with various embodiments of the disclosed subject matter.

The process-sequence timing chart 400 of FIG. 4A, using the same sequences or with slight variations, may be used with another embodiment of a divertless gas-dosing system. With reference now to FIG. 4C, another example of a divertless gas-dosing system 460 in accordance with various embodiments of the disclosed subject matter is shown.

FIG. 4C is shown to include a first gas inlet 467, a first inlet valve 469, a first flow controller 473 (e.g., an MFC), an optional controller-outlet valve 474, a line charge-volume (LCV) 475, a pressure sensor 477 coupled to the LCV 475, and an outlet valve 479 coupled to a process chamber 465. FIG. 4C is also shown to include an additional inlet valve and flow controller stage comprising a second gas inlet 481 and a second flow controller 487. If either of the flow controllers 473, 487 and the respective inlet valves 469, 483 are open (e.g., at a setting of SP for the flow controller), one or more precursor gases are flowing in a direction 471, 485, respectively, toward the LCV 475. If an inert gas flow (e.g., nitrogen (N$_2$) or argon (Ar)) is used, the inert gas flows in a direction 463 in an inert gas line 461 toward the process chamber 465. As with the inert gas line 441 of FIG. 4B, the inert gas line 461 may be considered optional on an inert gas is not used. Further, as will be recognizable to a person of ordinary skill in the art, upon reading and understanding the disclosed subject matter, each of the components of FIG. 4C may the same as or identical to like components shown in FIG. 4B.

Although the divertless gas-dosing system 460 shows one additional inlet valve and flow controller stage, upon reading and understanding the disclosed subject matter, a person of ordinary skill in the art will recognize that any number of additional inlet valve and flow controller stages may be added to the divertless gas-dosing system 460 and still be considered to be within a scope of the disclosure provided herein. Further, changes to the system such as a placement of, for example, the inlet valve and the flow controller relative to each other, are considered as being a part of the disclosure. That is, the inlet valve may be located downstream of the flow controller and still be considered to be within the scope of the present disclosure (with appropriate changes to the process-sequence timing chart 400 of FIG. 4A as may be needed). Additionally, only though a single LCV is shown, no such limitation should be construed. One or more additional LCV chambers may be added and also be within a scope of the disclosed subject matter.

Using the divertless gas-dosing system 460 of FIG. 4C, two or more flow controllers can flow into a single line charge-volume. The flow of the process gases can be stopped on both (or more than two) flow controllers at the same time at the same pressure or the LCV can be sequentially charged, for example, sequentially, by one flow controller followed by another flow controller (including more than two flow controllers) to create a desired mixture of gases at a desired ratio and pressure for release into the process chamber.

Additionally, the LCV can be heated to raise the condensation pressure of the gases contained therein such that a low vapor-pressure gas, such as, for example, tungsten hexafluoride (WF$_6$) can first pressurize the LCV 475 to, for example, 0.5 Bar (approximately 375 Torr) and then the gas within the LCV 475 is heated to about 60° C. and pressurized with Ar to about 2 Bar (approximately 1500 Torr) as described below with reference to FIG. 5. In a specific exemplary embodiment, after the LCV 475 is pressurized to about 375 Torr with WF$_6$, the optional controller-outlet valve 474 may be closed to isolate the first flow controller 473 from the pressure in the LCV 475.

Figure 4D:
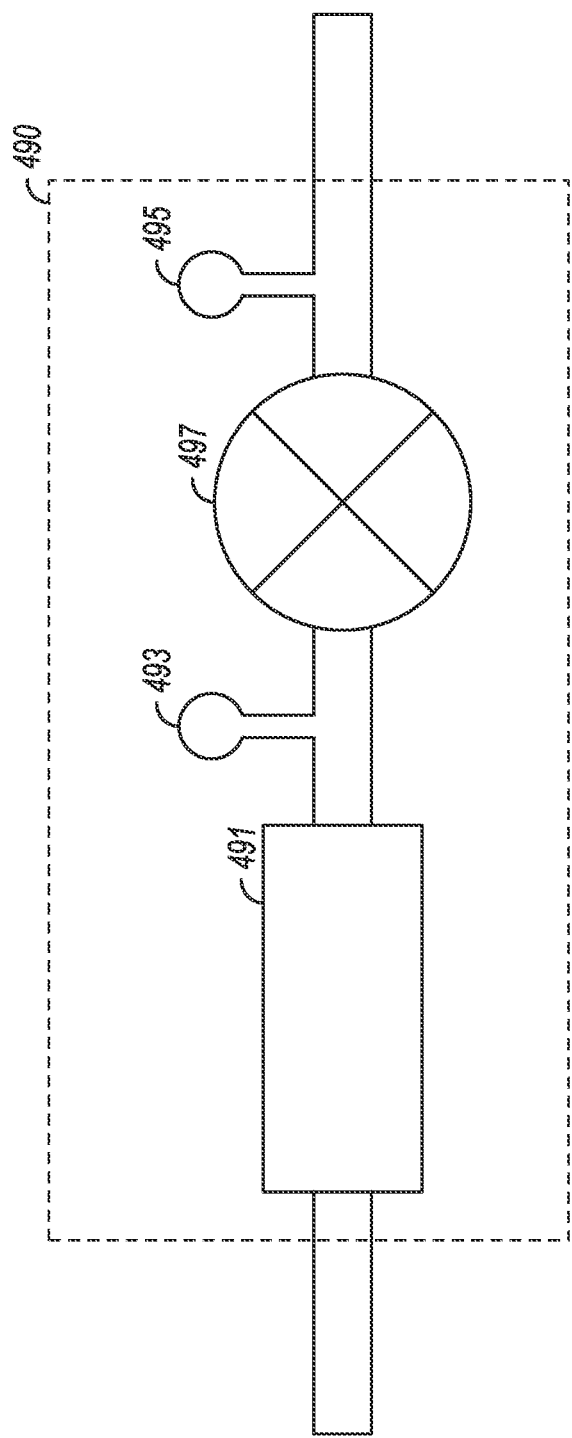
FIG. 4D shows an example of a self-calibrating flow meter that may be used in conjunctions with the divertless gas-dosing systems of FIGS. 4B and 4C.

FIG. 4D shows an example of a self-calibrating flow meter 490 that may be used in conjunction with the divertless gas-dosing systems 440, 460 of FIGS. 4B and 4C. The self-calibrating flow meter 490 is shown to include a flow meter 491, a first pressure sensor 493, a second pressure sensor 495, and a flow-control valve 497 with a position-sensing device (not shown explicitly).

In various exemplary embodiments, the flow meter 491 comprises, for example, a thermal mass-flow meter, a pressure-based flow meter (e.g., using an orifice to produce a pressure drop of a fluid being transported therethrough), a rate-of-decay flow meter, or other type of flow meter known in the relevant art. The flow meter 491 can be considered as an optional element in certain embodiments. A person of ordinary skill in the art will recognize that other means may be employed to determine the volumetric flow and/or the mass flow through the self-calibrating flow meter 490. For example, by measuring the differential pressure from the pressure sensors 493, 495 across the flow-control valve 497, the volumetric flow of the fluid may be determined. If the temperature, pressure, and thermodynamic properties of a fluid are known, the mass-flowrate may also be determined. Such an arrangement using a temperature sensor or temperature gauge is discussed in more detail below with reference to FIGS. 4F and 4G. The pressure sensors 493, 495 may be the same as or similar to the pressure sensors 457, 477 described above with reference to FIGS. 4B and 4C.

The pressure sensors 493, 495 may comprise various types of pressure sensors known in the art based upon, for example, piezoresistive, strain-gauge technology, capacitive pressure-sensing technology, electromagnetic pressure-sensing technology, piezoelectric pressure-sensing technology, and other technologies known in the relevant art.

The flow-control valve 497 may comprise one of various types of throttling valves (e.g., a ball valve, gate valve, butterfly valve, or other control valve), piezo valves, or other types of fluid-control valve known in the relevant art. The valves may be manually controlled or controllable automatically (e.g., pneumatically controlled, electrically controlled, or hydraulically controlled). The aforementioned position-sensing device is used to measure a distance or amount that the flow-control valve 497 is open.

In operation, the valve position is calibrated to pressures $P_1$ and $P_2$ as indicated by the pressure sensors 493, 495, respectively, as well as a flow-standard device (not shown explicitly but understandable to a skilled artisan). The flow meter 491, if used, may also be calibrated in accordance with a reading from the flow-standard device.

The soft-calibrating flow meter 490 may be operated in at least two modes. In a first mode of the self-calibrating flow meter 490, the position of the flow-control valve 497 is based on readings from the two pressure sensors 493, 495 and the calibration data. The first mode may be used to provide a fast response time (e.g., less than about 100 msec or less than about 10 msec). In a second mode of the self-calibrating flow meter 490, control of the flow-control valve 497 is based on feedback (e.g., an indicated volumetric flowrate or mass flowrate) from the flow meter 491. If embodiments where the self-calibrating flow meter 490 comprises an MFC, the second control mode may have a higher level of accuracy and/or a higher level of precision than the first control mode. Upon reading and understanding the disclosed subject matter, a person of ordinary skill in the art will understand when use of either the first mode or the second mode may be advantageous in a given application.

The self-calibrating flow meter 490 may be used serially with or in place of the flow controllers 453, 473, 487 of FIGS. 4B and 4C. Additionally, the second pressure sensor 495 may be used in conjunction with or replace the pressure sensors 457, 477 of FIGS. 4B and 4C. Moreover, the self-calibrating flow meter 490 may be periodically or continuously calibrated as indicated above.

Figure 4E:
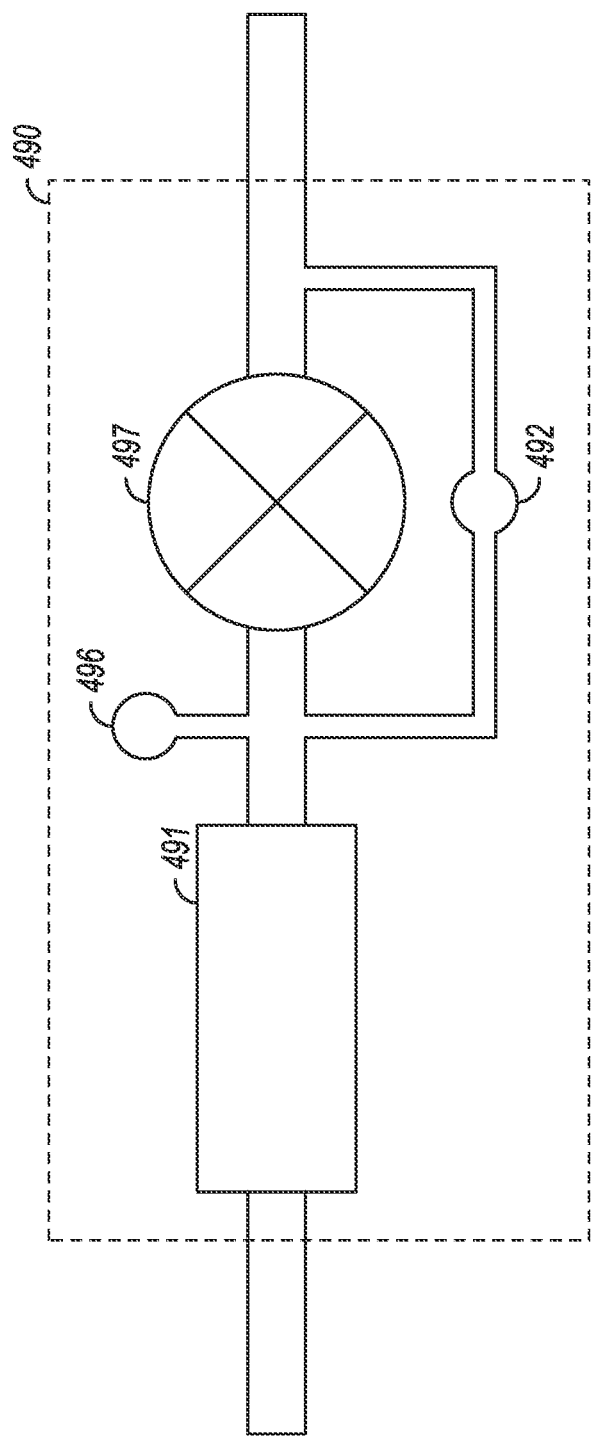
FIGS. 4E through 4G show examples of other self-calibrating flow meters that may be used in conjunctions with the divertless gas-dosing systems of FIGS. 4B and 4C.
Figure 4F:
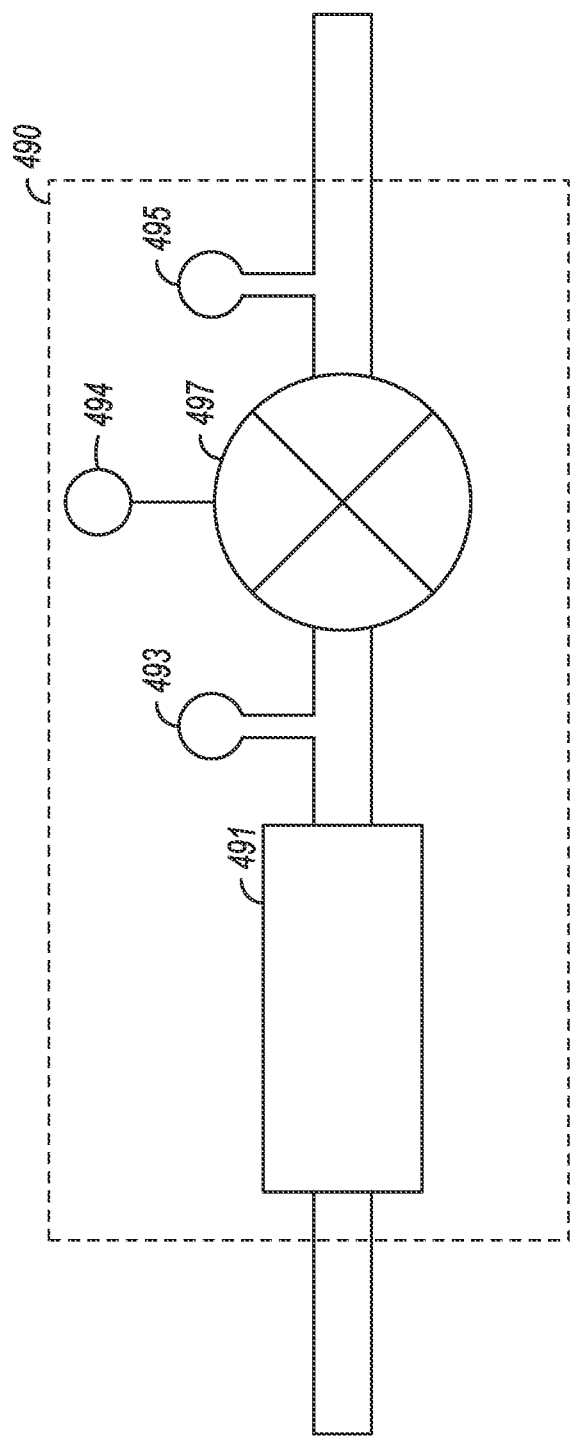
Figure 4G:
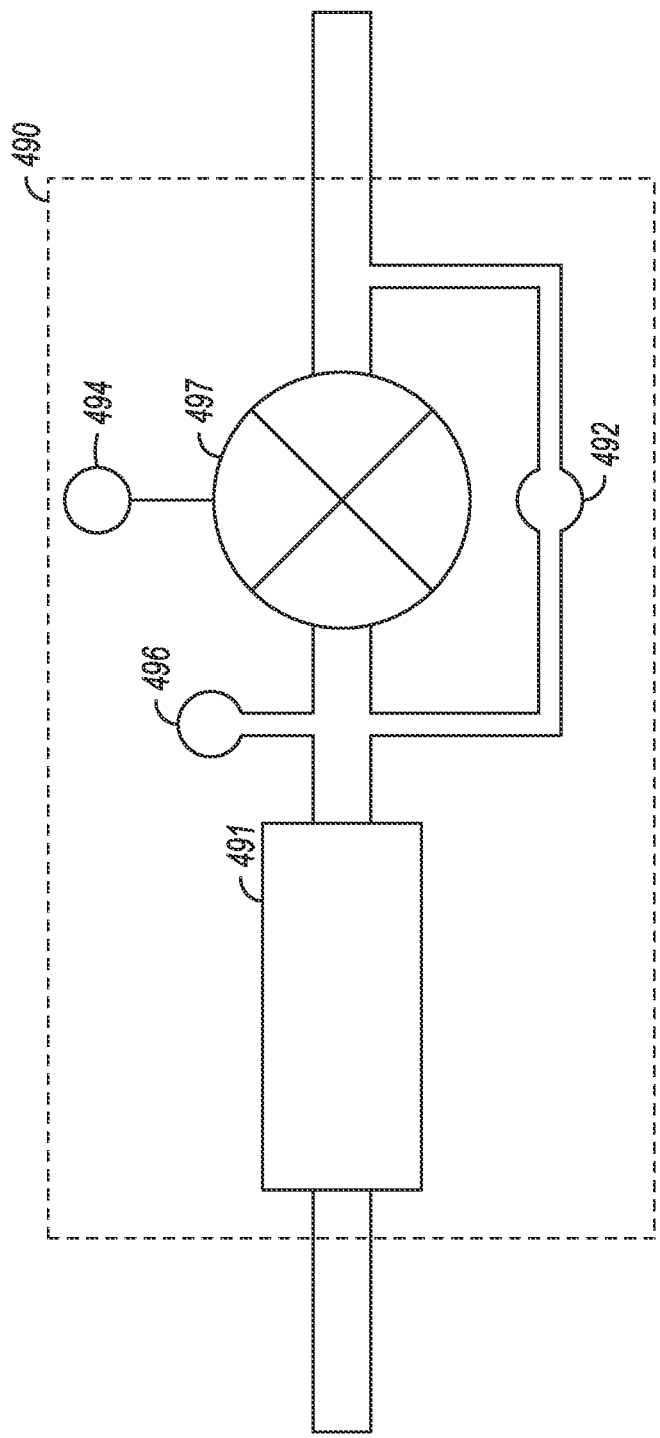

FIGS. 4E through 4G show examples of other self-calibrating flow meters that may be used in conjunctions with the divertless gas-dosing systems of FIGS. 4B and 4C. For example, FIG. 4E shows another exemplary embodiment of the self-calibrating flow meter 490 that uses a differential-pressure sensor 492, rather than the pressure sensors 493, 495 of FIG. 4D. The differential-pressure sensor 492 has a first leg coupled upstream of the flow-control valve 497 and a second leg coupled downstream of the flow-control valve 497. The differential-pressure sensor 492 may provide increased accuracy of a difference in pressure between an upstream pressure and a downstream pressure. Further, as discussed above, the flow meter 491 can be considered as an optional element in certain embodiments.

FIG. 4E is also shown to include a pressure sensor 496 located upstream of the flow-control valve 497. Although not shown explicitly, in other embodiments, the pressure sensor 496 may be located downstream of the flow-control valve 497. The pressure sensor 496 may be the same as or similar to one or both of, for example, the pressure sensors 493, 495 of FIG. 4D. The pressure sensor 496, depending on location, can be used to determine an inlet pressure or an outlet pressure of the flow-control valve 497 of gas flowing within the self-calibrating flow meter 490. For example, the differential-pressure sensor 492 may read a 260 Torr (approximately 5 psig) difference between the upstream and downstream pressures on either side of the flow-control valve 497. However, the actual flow rate would be different if the system has a pressure of 520 Torr (approximately 10 psig) in and 260 Torr out versus 780 Torr (approximately 15 psig) in and 520 Torr out. Moreover, as is known to a skilled artisan, the mass of gas is different at the different pressures. Consequently, both the mass flowrates and the volumetric flowrates could be substantially different. Additional embodiments are described below with reference to FIG. 4G.

A person of ordinary skill in the art will appreciate that the differential-pressure sensor 492 uses, for example, transducers to sense differential pressure between two portions of a fluid-flow path. The transducers can then convert the differential pressure to a proportional output. In another example, the differential-pressure sensor 492 uses a flexible diaphragm in proximity to a electrode to sense the differential pressure. For example, a positive pressure flexes the diaphragm toward the electrode, thereby increasing a value of capacitance between the diaphragm and the electrode. A decrease in the pressure moves the diaphragm away from the electrode, thereby decreasing the capacitance. A sensor coupled to each side of the sensor measures the difference in capacitance caused by the two pressures on each side of the diaphragm. one. Other types of differential pressure sensors or gauges are known. Further, as is known to a skilled artisan, differential pressure is not measured with reference to a specific reference pressure.

FIG. 4F shows another exemplary embodiment of the self-calibrating flow meter 490 that may be used in conjunction with the divertless gas-dosing systems 440, 460 of FIGS. 4B and 4C. The self-calibrating flow meter 490 is shown to include a flow meter 491, a first pressure sensor 493, a second pressure sensor 495, and a flow-control valve 497 with a position-sensing device (not shown explicitly). FIG. 4F is also shown to include a temperature sensor 494. Although the temperature sensor 494 is shown as being coupled to the flow-control valve 497, the temperature sensor may be coupled either upstream of or downstream of and proximate to the flow-control valve 497. Various types of temperature sensors and temperature gauges are known in the art. As discussed above, the flow meter 491 can be considered as an optional element in certain embodiments.

As is further known to a skilled artisan, various types of material expand and contract due to temperature changes. With continuing reference to FIG. 4F, if the ambient temperature in which the flow-control valve 497 is located changes, or self-heating of a piezo stack (discussed above) changes temperature, a relative position of the components, and consequently a reported output value of the affected components, can change. Additionally, flow passages upstream and/or downstream of, for example, flow-control valve 497, can change size and/or shape due to temperature changes. These size and shape changes can affect the flow characteristics of a fluid flowing within the system. Thus, a position of the flow-control valve 497 that delivers a specified flow (e.g., a predetermined value of flow) may change based on the flow-control valve 497 and surrounding flow passage temperatures. Moreover, properties of the gas will change based on temperature. For at least these reasons, to achieve a high-level of calibration accuracy, the temperature in the area of the flow path in and proximate to the flow-control valve 497 can be monitored and fed back into the algorithm for the flow-control valve 497 in this embodiment.

FIG. 4G shows another exemplary embodiment of the self-calibrating flow meter 490 that also uses a differential-pressure sensor 492, rather than the pressure sensors 493, 495 of FIG. 4D and FIG. 4F. As noted above with reference to FIG. 4E, the differential-pressure sensor 492 has a first leg coupled upstream of the flow-control valve 497 and a second leg coupled downstream of the flow-control valve 497. The differential-pressure sensor 492 may be the same as or similar to the differential-pressure sensor 492 described with reference to FIG. 4E. Further, as discussed above, the flow meter 491 can be considered as an optional element in certain embodiments. As described above, the differential-pressure sensor 492 may provide increased accuracy of a difference in pressure between an upstream pressure and a downstream pressure.

As with FIG. 4F described above. FIG. 4G is also shown to include a temperature sensor 494. Although the temperature sensor 494 is shown as being coupled to the flow-control valve 497, the temperature sensor may be coupled either upstream of or downstream of and proximate to the flow-control valve 497. The temperature sensor 494 may be the same as or similar to the temperature sensor 494 of FIG. 4F.

Additionally, FIG. 4G is shown to include a pressure sensor 496 located upstream of the flow-control valve 497. Although not shown explicitly, in other embodiments, the pressure sensor 496 may be located downstream of the flow-control valve 497. The pressure sensor 496 may be the same as or similar to one or both of, for example, the pressure sensors 493, 495 of FIG. 4D or the pressure sensor of FIG. 4E. As FIG. 4E is described above with reference to FIG. 4E, depending on location, the pressure sensor 496 can be used to determine an inlet pressure or an outlet pressure of the flow-control valve 497 of gas flowing within the self-calibrating flow meter 490. The pressure sensor 496, the differential-pressure sensor 492, and the temperature sensor 494 can send respective signals to, for example, a central controller or processor (not shown) to calculate an actual mass flowrate and/or volumetric flowrate both upstream and downstream of the flow-control valve 497 based on the measured temperature and measured pressures.

Figure 5:
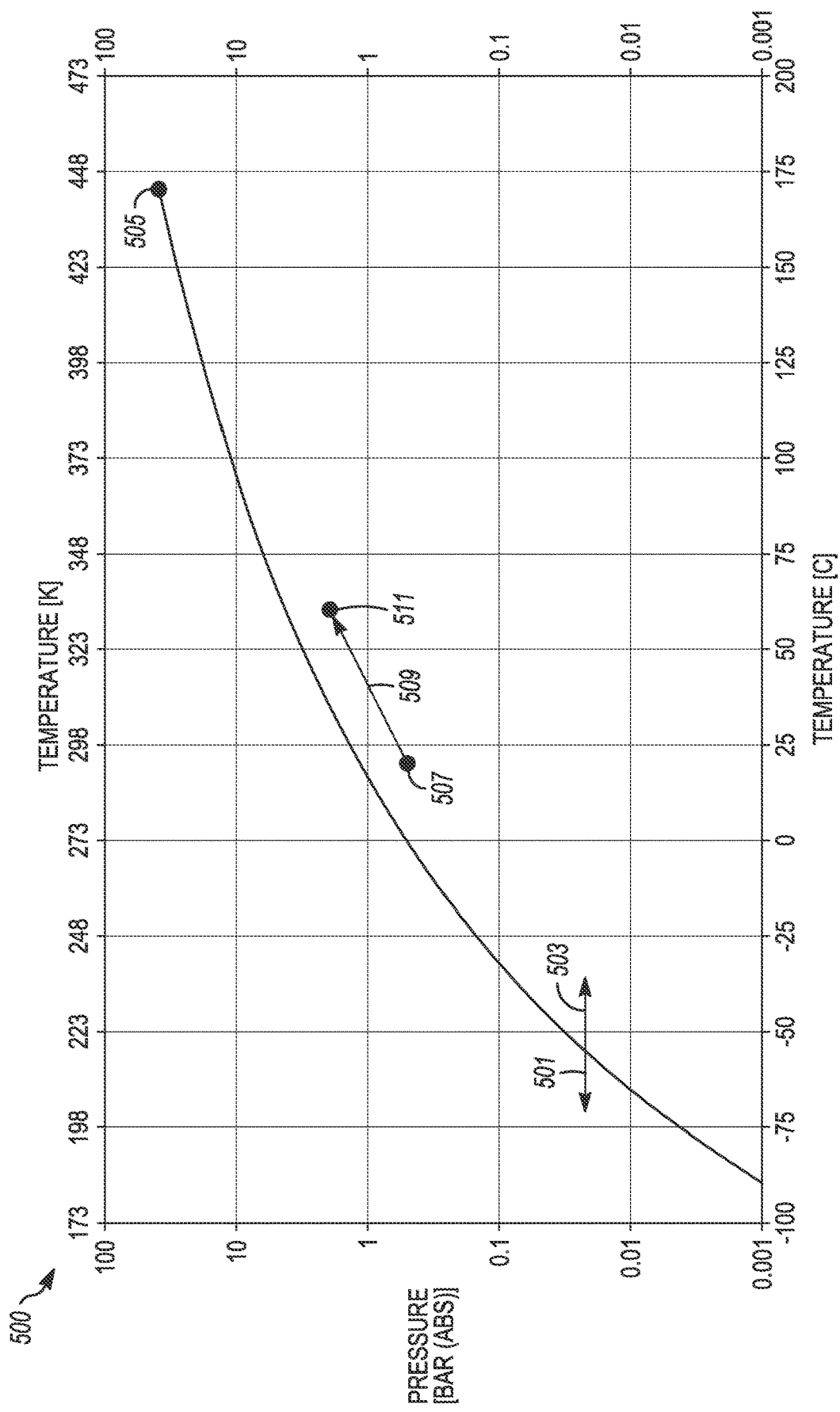
FIG. 5 shows an example of a vapor-pressure graph including an LCV two-step pressurization adjustment in accordance with various embodiments of the disclosed subject matter.

Referring to FIG. 5, an example of a vapor-pressure graph 500 including an LCV two-step pressurization adjustment in accordance with various embodiments of the disclosed subject matter is shown. The vapor-pressure graph 500 shows a $WF_6$ vapor curve of pressure as a function of temperature, where a critical point 505 of the $WF_6$ gas is also shown. (The skilled artisan will recognize that $WF_6$, or most other molecules, have thermodynamic properties that can be considered so as not to, for example, go beyond the critical point 505.) Further, as is recognizable to a skilled artisan, $WF_6$ to the right 503 of the vapor-pressure graph is in a gaseous phase while $WF_6$ to the left 501 of the curve is in a liquid phase. In accordance with various embodiments, an example of a two-step pressurization adjustment can include: (1) Step 1 (operation 507)—pressurizing the $WF_6$ gas within the LCV to about 0.53 Bar (approximately 400 Torr) at about room temperature (approximately 20° C.); and increasing the temperature and pressure to move the $WF_6$ gas along the line 509 on the pressure-temperature curve in the gas phase to (2) Step 2 (operation 511)—adding argon (Ar) and increasing the pressure of the gas mixture to about 2 Bar (approximately 1500 Torr) at a temperature of about 60° C.

Consequently, multiple gases can be mixed in or before the LCV and the LCV pressurized (and heated as desired) to provide a high-pressure reservoir of gas that can be delivered quickly to the process chamber, thus speeding up the ALD process. The volume of the LCV and associated piping can be calibrated such that the rate of rise during flow into the LCV can provide an independent measurement of the MFC flowrate, thereby providing a means to calibrate MFCs during their lifetime. For example, multiple mass-flow controllers can be used with multiple gases (e.g., $WF_6$ and $H_2$ to different volumes and mixture ratios). Each of the changes for a particular gas or mixture of gases, as well as changes to various process recipes for the sequential charging operations of the LCV, can be stored within the process tool or a device configured to execute commands on the process tool as described below in more detail. In other embodiments, each of the multiple mass-flow controllers can be separately coupled to a different LCV. Additionally, each of the different LCVs can be coupled to a single outlet valve, thus controlling flow into the process chamber substantially concurrently from all of the LCVs. In other embodiments, each of the different LCV can be coupled separately to multiple outlet valves with one outlet valve for each of the LCVs.

As noted above, in in accordance with the various embodiments presented herein, the divert valve 185 of FIG. 1B is eliminated, along with the tubing connections from the divert valve to a vacuum source and associated hardware. Instead, an inlet valve is added, or an existing valve is repurposed, for use in the delivery of one or more precursors to the process chamber. Further, a pressure sensor is added, or an existing pressure sensor is repurposed, to be used as a variable for controlling a process sequence (e.g., the process-sequence timing chart 400 of FIG. 4A).

Therefore, some advantages over the prior art include, for example, no waste of precious precursor gases by not having any gas bypass the process chamber, thereby saving cost-of-ownership and cost-of-consumables for the owner of the process tool. Divert valves and associated hardware are not required leading to a lower cost. Further, a concomitant ability to package the components of the divertless system described herein in a tighter space is enhanced over the divert systems of the prior art. Since pressurization of the LCV is based on pressure measurement and not time as is currently used under the existing art, the differences in MFC ramp speed and curve shape (e.g., see FIG. 3) are compensated by variable time of LCV filling, thereby reducing the delivery variability of precursor gases to the substrate, leading to improved uniformity within a substrate, improved consistency substrate-to-substrate, and improved consistency batch-to-bath. Therefore, no divert valve and no diversion of precursor gases to a foreline is required or needed in any form.

For example, in various embodiments, a flow controller (e.g., an MFC) used with the disclosed subject matter described above with regard to FIGS. 4A through 4C and FIG. 5 may be configured to operate in at least three distinct modes: (1) a flow control mode—the nominal mode of an MFC; (2) a pressure control mode—the MFC controls the LCV up to and including a determined pressure based on a feedback loop from the pressure sensor; and (3) a hold mode—the MFC holds the control valve within the MFC with a positional feedback of the control valve (e.g., move the control valve to a given position, start flowing the precursor gas, then adjust flow; the control valve can also be set to return to a predetermined position for a given flowrate so there is a limited rise time for open loop control). These three different modes can make use of firmware and/or software changes to the MFC or firmware/software external to and controlling the MFC.

As described above, the operation of the inlet valve and the outlet valve, the pressure sensor, and the MFC are coordinated to run the sequential process, which may be implemented in tool-level or system-level firmware and/or software.

Such methods and various process recipes as described above may be run on various types of devices as described below in more detail. Various ones of the timing sequences and/or the thermodynamic properties can be stored as an algorithm or in a lookup table on various types of devices known in the art. The devices include, for example, a computer or microprocessor, a special-purpose processor, such as a field-programmable gate array (FPGA) or an application-specific integrated circuit (ASIC) that is programmed, in software, firmware, or as a hardware implementation, with one or more aspects of the disclosed subject matter described above.

Certain embodiments or process recipes described herein may be performed using various types of logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various embodiments, one or more computer systems (e.g., a standalone computer system, a client computer system, or a server computer system) or one or more hardware modules of a process tool or computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as an FPGA or an ASIC.

A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor, for example, to constitute a particular hardware-module at one instance of time and to constitute a different hardware module at a different instance of time.

Hardware modules can provide information to, and receive information from, other hardware modules. Accordingly, the described hardware modules may be regarded as being communicatively coupled (e.g., to run one or more process recipes). Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods and process recipes described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods and process recipes, either explicitly or impliedly described herein, may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine (e.g., a process tool), but deployed across a number of machines. In some embodiments, the one or more processors or processor-implemented modules may be located in a single geographic location (e.g., within a home environment, an office environment, a server farm, or a fabrication facility (fab)). In other embodiments, the one or more processors or processor-implemented modules may be distributed across a number of geographic locations.

As used herein, the term "or" may be construed in an inclusive or exclusive sense. Further, other embodiments will be understood by a person of ordinary skill in the art based upon reading and understanding the disclosure provided. Moreover, the person of ordinary skill in the art will readily understand that various combinations of the techniques and examples provided herein may all be applied in various combinations.

Throughout this specification, plural instances may implement components, operations, or structures described as a single instance. Although individual operations of one or more methods are illustrated and described as separate operations, one or more of the individual operations may be performed concurrently, and, unless otherwise stated, nothing requires that the operations necessarily be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter described herein.

Although various embodiments are discussed separately, these separate embodiments are not intended to be considered as independent techniques or designs. As indicated above, each of the various portions may be inter-related and each may be used separately or in combination with other embodiments of the disclosed subject matter discussed herein. For example, although various embodiments of methods, operations, systems, and processes have been described, these methods, operations, systems, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to ascertain quickly the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The Following Numbered Examples Include Embodiments of the Disclosed Subject Matter Example 1: In an embodiment, the disclosed subject matter includes a divertless, gas-dosing system. The divertless, gas-dosing system includes a process gas inlet pneumatically coupled to an inlet valve, a flow controller pneumatically coupled to the inlet valve, and a line charge-volume (LCV) pneumatically coupled to be downstream of the inlet valve and the flow controller. The LCV is to receive an initial single-dose of a process gas. A pressure sensor is coupled to the LCV to determine a pressure level within the LCV. An outlet valve is pneumatically coupled to be downstream of the LCV. The outlet valve is to be coupled pneumatically to a process chamber on a downstream side of the outlet valve. The flow controller is arranged to control a flow of the process gas to the process chamber independently of the inlet valve and substantially to maintain the flow at a pre-determined set point when the outlet valve is opened. The divertless, gas-dosing system is time independent with regard to a magnitude of the initial single-dose of the process gas.

Example 2: The system of Example 1, further comprising an inert gas line pneumatically coupled to be downstream from the outlet valve, the inert gas line is further to be coupled to the process chamber.

Example 3: The system of either Example 1 or Example 2, wherein the LCV is an accumulator chamber.

Example 4: The system of any one of the preceding Examples, wherein no divert valve and no diversion of precursor gases to a foreline is used within the gas-dosing system.

Example 5: The system of any one of the preceding Examples, wherein a determination of the initial single-dose of the process gas is based solely on the determined pressure level within the LCV. A determination of the initial single-dose of the process gas is not to be based on a time required to charge the LCV to a level of the initial single-dose of the process gas.

Example 6: The system of any one of the preceding Examples, wherein the flow controller is coupled downstream of the inlet valve.

Example 7: The system of any one of the preceding Examples, wherein a ramp-up speed and a ramp-down speed of the flow controller is to be compensated by the determined pressure level within the LCV.

Example 8: The system of any one of the preceding Examples, wherein a shape of a ramp curve of the flow controller is to be compensated by the determined pressure level within the LCV.

Example 9: The system of any one of the preceding Examples, wherein the flow controller is to operate in at least one of three modes selected from modes including: a flow control mode, wherein the flow controller is configured to control a flowrate of the process gas; a pressure control mode, wherein the flow controller is configured to control the LCV up to and including a determined pressure within the LCV based on a feedback loop from the pressure sensor; and a hold mode, wherein the flow controller is to hold a control valve within the flow controller based on a positional feedback of the control valve.

Example 10: The system of any one of the preceding Examples, wherein the outlet valve is to remain closed until after the pressure sensor indicates that the pressure level within the LCV is at a predetermined level.

Example 11: The system of Example 10, wherein a determination that the pressure sensor indicates that the pressure level within the LCV is at the predetermined level, is indicative that the initial single-dose of process gas has charged the LCV.

Example 12: The system of Example 10, wherein the outlet valve is configured to be opened after the pressure sensor indicates that the pressure level within the LCV is at the predetermined level Example 13: The system of Example 12, wherein the initial single-dose of the process gas, along with a flow pulse, is to be delivered to the process chamber after the outlet valve is opened.

Example 14: The system of any one of the preceding Examples, wherein at least the inlet valve is to remain open until the pressure sensor indicates that the pressure level within the LCV is at a predetermined level. After the pressure level within the LCV is at the predetermined level, the inlet valve is to be closed.

Example 15: The system of any one of the preceding Examples, further including a self-calibrating flow meter. The self-calibrating flow meter includes a flow-control valve and a second pressure sensor located upstream of the flow-control valve. The flow-control valve and the second pressure sensor are both located downstream from the flow controller.

Example 13: The self-calibrating flow meter of Example 15, further comprising a third pressure sensor located downstream of the flow-control valve and upstream of the LCV.

Example 17: The self-calibrating flow meter of Example 16, wherein the self-calibrating flow meter is to operate in at least one of two modes selected from modes including: a first mode in which a position of the flow-control valve is to be based on readings from the pressure sensor, at least one of the second pressure sensor and the third pressure sensor, and calibration data of the flow controller, the first mode being configured to provide a faster response time than a second mode. The second mode in which control of the flow-control valve is to be based on feedback received from the flow controller, the second mode being configured to provide at least one of a higher level of accuracy and a higher precision than the first mode.

Example 18: The system of any one of the preceding Examples, further including a self-calibrating flow meter. The self-calibrating flow meter includes a flow-control valve and a differential-pressure sensor coupled across the flow-control valve. The differential-pressure sensor has a first leg coupled upstream of the flow-control valve and a second leg coupled downstream of the flow-control valve.

Example 19: The self-calibrating flow meter of Example 18, further including a temperature sensor coupled proximate to the flow-control valve and upstream of the LCV.

Example 20: The self-calibrating flow meter of Example 19, wherein the self-calibrating flow meter is to operate in at least one of two modes selected from modes including a first mode in which a position of the flow-control valve is to be based on readings from the pressure sensor, at least one of the differential-pressure sensor and the temperature sensor, and calibration data of the flow controller. The first mode is to provide a faster response time than a second mode. The second mode in which control of the flow-control valve is to be based on feedback received from the flow controller. The second mode is to provide at least one of a higher level of accuracy and a higher precision than the first mode.

Example 21: In an embodiment, the disclosed subject matter includes an apparatus to supply precursor gas. The apparatus includes a precursor gas inlet pneumatically coupled to an inlet valve, a flow controller pneumatically coupled to be downstream of the inlet valve, and a line charge-volume (LCV) pneumatically coupled to be downstream of the flow controller. The LCV is to be charged with an initial single-dose of the precursor gas. A pressure sensor is coupled to the LCV to determine a pressure level within the LCV. The initial single-dose of the precursor gas is to be determined based on a pressure level within the LCV. An outlet valve is pneumatically coupled to be downstream of the LCV. The outlet valve is arranged to be coupled pneumatically on a downstream side of the outlet valve to a process chamber. The outlet valve is further arranged to be opened to release the initial single-dose of the precursor gas to the process chamber after the pressure level of the LCV reaches a predetermined value. The flow controller is to control a flow of the precursor gas to the process chamber independently of the inlet valve and substantially to maintain the flow at a pre-determined set point when the outlet valve is opened. The apparatus is time independent with regard to a magnitude of the initial single-dose of the process gas.

Example 22: The apparatus of Example 21, wherein the LCV is a gas accumulator.

Example 23: The apparatus of either Example 21 or Example 22, wherein no divert valve and no diversion of precursor gases to a foreline is used within the gas-dosing apparatus.

Example 24: The apparatus of any one of Example 21 through Example 23, wherein the flow controller comprises a mass-flow controller.

Example 25: The apparatus of any one of Example 21 through Example 24, wherein the flow controller is to operate in at least one of three modes selected from modes including a flow control mode, wherein the flow controller is to control a flowrate of the precursor gas; a pressure control mode, wherein the flow controller is to control the LCV up to and including a determined pressure within the LCV based on a feedback loop from the pressure sensor; and a hold mode, wherein the flow controller is configured to hold a control valve within the flow controller based on a positional feedback of the control valve.

Example 26: The apparatus of any one of Example 21 through Example 25, wherein the outlet valve is to remain closed until after the pressure sensor indicates that the pressure level within the LCV is at a predetermined level.

Example 27: The apparatus of Example 26, wherein the outlet valve is to be opened after the pressure sensor indicates that the pressure level within the LCV is at the predetermined level.

Example 28: The apparatus of any one of Example 21 through Example 27, wherein at least the inlet valve is configured to remain open until the pressure sensor indicates that the pressure level within the LCV is at a predetermined level. After the pressure level within the LCV is at the predetermined level, the inlet valve is to be closed.

Example 29: The apparatus of any one of Example 21 through Example 28, further comprising a self-calibrating flow meter including a flow-control valve and a second pressure sensor located upstream of the flow-control valve. The flow-control valve and the second pressure sensor are both located downstream from the flow controller.

Example 30: The self-calibrating flow meter of Example 29, further including a third pressure sensor located downstream of the flow-control valve and upstream of the LCV.

Example 31: The self-calibrating flow meter of Example 30, wherein the self-calibrating flow meter is to operate in at least one of two modes selected from modes including a first mode in which a position of the flow-control valve is to be based on readings from the pressure sensor, at least one of the second pressure sensor and the third pressure sensor, and calibration data of the flow controller. The first mode is to provide a faster response time than a second mode. The second mode in which control of the flow-control valve is to be based on feedback received from the flow controller. The second mode is to provide at least one of a higher level of accuracy and a higher precision than the first mode.

Example 32: The apparatus of any one of Example 21 through Example 31, further comprising: a self-calibrating flow meter including a flow-control valve and a differential-pressure sensor coupled across the flow-control valve. The differential-pressure sensor has a first leg coupled upstream of the flow-control valve and a second leg coupled downstream of the flow-control valve.

Example 33: The self-calibrating flow meter of Example 32, further including a temperature sensor coupled proximate to the flow-control valve and upstream of the LCV.

Example 34: The self-calibrating flow meter of Example 33, wherein the self-calibrating flow meter is configured to operate in at least one of two modes selected from modes including a first mode in which a position of the flow-control valve is to be based on readings from the pressure sensor, at least one of the differential-pressure sensor and the temperature sensor, and calibration data of the flow controller, the first mode being configured to provide a faster response time than a second mode. The second mode in which control of the flow-control valve is to be based on feedback received from the flow controller, the second mode being configured to provide at least one of a higher level of accuracy and a higher precision than the first mode.

Example 35: In various embodiments, the disclosed subject matter includes a divertless, gas-dosing system. The divertless, gas-dosing system includes a first process gas inlet pneumatically coupled to a first inlet valve to receive a first process gas, a second process gas inlet pneumatically coupled to a second inlet valve to receive a second process gas, a first flow controller and a second flow controller pneumatically coupled separately to be downstream of the first inlet valve and the second inlet valve, respectively, and at least one, line charge-volume (LCV) pneumatically coupled to be downstream of first flow controller and the second flow controller. The at least one LCV is to receive an initial single-dose of at least one of a mixture of the first process gas and the second process gas and separate initial single-doses of the first process gas and the second process gas. At least one pressure sensor is coupled separately to respective ones of the at least one LCV to determine a pressure level within each of the at least one LCVs. An outlet valve is pneumatically coupled to be downstream of the at least one LCV. The outlet valve is to be coupled pneumatically on a downstream side of the outlet valve to a process chamber. The divertless, gas-dosing system is time independent with regard to a magnitude of the initial single-dose of the process gas.

Example 36: The system of Example 35, wherein the first process gas inlet and the second process gas inlet are to be coupled to process gas supplies comprising different precursor gases.

Example 37: The system of either Example 35 or Example 36, further including at least one additional outlet valve pneumatically coupled separately to each of the at least one LCVs.

Example 38: The system of any one of Example 35 through Example 37, further comprising a plurality of outlet valves, wherein one of the plurality of outlet valves is coupled separately to respective ones of the at least one LCV.

Example 39: The system of any one of Example 35 through Example 38, wherein the outlet valve comprises a single outlet valve coupled pneumatically to and downstream from each of the at least one LCVs.

Example 40: The system of any one of Example 35 through Example 39, further including a first self-calibrating flow meter and a second self-calibrating flow meter located downstream from the first flow controller and the second flow controller, respectively. Each of the first self-calibrating flow meter and the second self-calibrating flow meter includes a flow-control valve and a second pressure sensor located upstream of the flow-control valve.

Example 41: The first self-calibrating flow meter and the second self-calibrating flow meter of Example 40, each further including a third pressure sensor located downstream of the respective flow-control valve and upstream of the at least one LCV.

Example 42: The first self-calibrating flow meter and the second self-calibrating flow meter of Example 41, wherein each of first self-calibrating flow meter and the second self-calibrating flow meter is to operate in at least one of two modes selected from modes including a first mode in which a position of the flow-control valve is to be based on readings from the pressure sensor, at least one of the second pressure sensor and the third pressure sensor, and calibration data of the flow controller. The first mode is to provide a faster response time than a second mode. The second mode in which control of the flow-control valve is to be based on feedback received from the flow controller. The second mode is to provide at least one of a higher level of accuracy and a higher level of precision than the first mode.

Example 43: The system of any one of Example 35 through Example 42, further comprising a first self-calibrating flow meter and a second self-calibrating flow meter located downstream from the first flow controller and the second flow controller, respectively. Each of the first self-calibrating flow meter and the second self-calibrating flow meter includes a flow-control valve and a differential-pressure sensor coupled across the respective flow-control valve. The differential-pressure sensor has a first leg coupled upstream of the flow-control valve and a second leg coupled downstream of the flow-control valve.

Example 44: The first self-calibrating flow meter and the second self-calibrating flow meter of Example 43, each further including a temperature sensor coupled proximate to the respective flow-control valve and upstream of the at least one LCV.

Example 45: The first self-calibrating flow meter and the second self-calibrating flow meter of Example 44, wherein each of first self-calibrating flow meter and the second self-calibrating flow meter is to operate in at least one of two modes selected from modes including a first mode in which a position of the flow-control valve is to be based on readings from the pressure sensor, at least one of the differential-pressure sensor and the temperature sensor, and calibration data of the flow controller. The first mode is to provide a faster response time than a second mode. The second mode in which control of the flow-control valve is to be based on feedback received from the flow controller. The second mode is to provide at least one of a higher accuracy and a higher level of precision than the first mode.

What is claimed is:
1. A divertless, gas-dosing system comprising:
  a process gas inlet pneumatically coupled to an inlet valve;
  a flow controller pneumatically coupled to the inlet valve;
  a self-calibrating flow meter having a flow-control valve, the self-calibrating flow meter located downstream from the flow controller;
  a line charge-volume (LCV) pneumatically coupled to be downstream of the inlet valve and the flow controller, the LCV being configured to receive an initial volume of a process gas;
  a pressure sensor coupled to the LCV to determine a pressure level within the LCV; and
  an outlet valve pneumatically coupled to be downstream of the LCV, the outlet valve configured to be coupled pneumatically to a process chamber on a downstream side of the outlet valve, with no divert gas path between the outlet valve and the process chamber, the flow controller being configured to control a flow of the process gas to the process chamber independently of the inlet valve and substantially to maintain the flow at a pre-determined set point when the outlet valve is opened, the divertless, gas-dosing system being time independent with regard to a magnitude of the initial volume of the process gas.

2. The system of claim 1, wherein no divert valve and no diversion of precursor gases to a foreline is used within the gas-dosing system.

3. The system of claim 1, wherein:
a determination of the initial volume of the process gas is based solely on the determined pressure level within the LCV; and
a determination of the initial volume of the process gas is not to be based on a time required to charge the LCV to a level of the initial volume of the process gas.

4. The system of claim 1, wherein a ramp-up speed and a ramp-down speed of the flow controller is to be compensated by the determined pressure level within the LCV.

5. The system of claim 1, wherein the flow controller is configured to operate in at least one of three modes that is selected from modes including:
a flow control mode, wherein the flow controller is configured to control a flowrate of the process gas;
a pressure control mode, wherein the flow controller is configured to control the LCV tap to and including a determined pressure within the LCV based on a feedback loop from the pressure sensor; and
a hold mode, wherein the flow controller is configured to hold a control valve within the flow controller based on a positional feedback of the control valve.

6. The system of claim 1, wherein the outlet valve is configured to remain closed until after the pressure sensor indicates that the pressure level within the LCV is at a predetermined level.

7. The system of claim 1, further comprising a second pressure sensor located upstream of the flow-control valve, the flow-control valve and the second pressure sensor both located downstream from the flow controller.

8. The self-calibrating flow meter of claim 7, further comprising a third pressure sensor located downstream of the flow-control valve and upstream of the LCV, wherein the self-calibrating flow meter is configured to operate in at least one of two modes that is selected from modes including:
a first mode in which a position of the flow-control valve is to be based on readings from the pressure sensor, at least one of the second pressure sensor and the third pressure sensor, and calibration data of the flow controller, the first mode being configured to provide a faster response time than a second mode; and
the second mode in which control of the flow-control valve is to be based on feedback received from the flow controller, the second mode being configured to provide at least one of a higher accuracy and a higher precision than the first mode.

9. The system of claim 1, further comprising:
a differential-pressure sensor coupled across the flow-control valve, the differential-pressure sensor having a first leg coupled upstream of the flow-control valve and a second leg coupled downstream of the flow-control valve; and
a temperature sensor coupled proximate to the flow-control valve and upstream of the LCV, wherein the self-calibrating flow meter is configured to operate in at least one of two modes that is selected from modes including:
a first mode in which a position of the flow-control valve is to be based on readings from the pressure sensor, at least one of the differential-pressure sensor and the temperature sensor, and calibration data of the flow controller, the first mode being configured to provide a faster response time than a second mode; and
the second mode in which control of the flow-control valve is to be based on feedback received from the flow controller, the second mode being configured to provide at least one of a higher accuracy and a higher precision than the first mode.

10. An apparatus to supply precursor gas, the apparatus comprising:
a precursor gas inlet pneumatically coupled to an inlet valve;
a flow controller pneumatically coupled to be downstream of the inlet valve;
a self-calibrating flow meter having a flow-control valve, the self-calibrating flow meter located downstream from the flow controller;
a line charge-volume (LCV) pneumatically coupled to be downstream of the flow controller, the LCV to be charged with an initial volume of the precursor gas;
a pressure sensor coupled to the LCV to determine a pressure level within the LCV, the initial volume of the precursor gas to be determined based on a pressure level within the LCV; and
an outlet valve pneumatically coupled to be downstream of the LCV, the outlet valve configured to be coupled pneumatically on a downstream side of the outlet valve to a process chamber, with no divert gas path between the outlet valve and the process chamber, the outlet valve configured to be opened to release the initial volume of the precursor gas to the process chamber after the pressure level of the LCV reaches a predetermined value, the flow controller being configured to control a flow of the precursor gas to the process chamber independently of the inlet valve and substantially to maintain the flow at a pre-determined set point when the outlet valve is opened, the apparatus being time independent with regard to a magnitude of the initial volume of the process gas.

11. The apparatus of claim 10, wherein no divert valve and no diversion of precursor gases to a foreline is used within the gas-dosing apparatus.

12. The apparatus of claim 10, wherein the flow controller is configured to operate in at least one of three modes that is selected from modes including:
a flow control mode, wherein the flow controller is configured to control a flowrate of the precursor gas;
a pressure control mode, wherein the flow controller is configured to control the LCV up to and including a determined pressure within the LCV based on a feedback loop from the pressure sensor; and
a hold mode, wherein the flow controller is configured to hold a control valve within the flow controller based on a positional feedback of the control valve.

13. The apparatus of claim 10, further comprising:
a second pressure sensor located upstream of the flow-control valve, the flow-control valve and the second pressure sensor both located downstream from the flow controller; and
a third pressure sensor located downstream of the flow-control valve and upstream of the LCV, wherein the self-calibrating flow meter is configured to operate in at least, one of two modes that is selected from modes including:
a first mode in which a position of the flow-control valve is to be based on readings from the pressure sensor, at least one of the second pressure sensor and the third pressure sensor, and calibration data of the flow controller, the first mode being configured to provide a faster response time than a second mode; and the second mode in which control of the flow-control valve is to be based on feedback received from the flow controller, the second mode being configured to provide at least one of a higher accuracy and a higher precision than the first mode.

14. The apparatus of claim 10, further comprising:

a differential-pressure sensor coupled across the flow-control valve, the differential-pressure sensor having a first leg coupled upstream of the flow-control valve and a second leg coupled downstream of the flow-control valve;

a temperature sensor coupled proximate to the flow-control valve and upstream of the LCV, wherein the self-calibrating flow meter is configured to operate in at least one of two modes that is selected from modes including:

a first mode in which a position of the flow-control valve is to be based on readings from the pressure sensor, at least one of the differential-pressure sensor and the temperature sensor, and calibration data of the flow controller, the first mode being configured to provide a faster response time than a second mode; and the second mode in which control of the flow-control valve is to be based on feedback received from the flow controller, the second mode being configured to provide at least one of a higher accuracy and a higher precision than the first mode.

15. A divertless, gas-dosing system comprising:

a first process gas inlet pneumatically coupled to a first inlet valve to receive a first process gas;

a second process gas inlet pneumatically coupled to a second inlet valve to receive a second process gas;

a first flow controller and a second flow controller pneumatically coupled separately to be downstream of the first inlet valve and the second inlet valve, respectively;

a first self-calibrating flow meter and a second self-calibrating flow meter located downstream from the first flow controller and the second flow controller, respectively, each of the first self-calibrating flow meter and the second self-calibrating flow meter including a flow-control valve;

at least one, line charge-volume (LCV) pneumatically coupled to be downstream of first flow controller and the second flow controller, the at least one LCV being configured to receive an initial volume of at least one of a mixture of the first process gas and the second process gas and separate initial volumes of the first process gas and the second process gas;

at least one pressure sensor coupled separately to respective ones of the at least one LCV to determine a pressure level within each of the at least one LCVs; and an outlet valve pneumatically coupled to be downstream of the at least one LCV, the outlet valve configured to be coupled pneumatically on a downstream side of the outlet valve to a process chamber, with no divert gas path between the outlet valve and the process chamber, the divertless, gas-dosing system being time independent with regard to a magnitude of the initial volume of the process gas.

16. The system of claim 15, wherein the first process gas inlet and the second process gas inlet are configured to be coupled to process gas supplies comprising different precursor gases.

17. The system of claim 15, further comprising a second pressure sensor located upstream of the flow-control valve.

18. The first self-calibrating flow meter and the second self-calibrating flow meter of claim 17, each further comprising a third pressure sensor located downstream of the respective flow-control valve and upstream of the at least one LCV.

19. The first self-calibrating flow meter and the second self-calibrating flow meter of claim 18, wherein each of the first self-calibrating flow meter and the second self-calibrating flow meter is configured to operate in at least one of two modes that is selected from modes including:

a first mode in which a position of the flow-control valve is to be based on readings from the pressure sensor, at least one of the second pressure sensor and the third pressure sensor, and calibration data of the flow controller, the first mode being configured to provide a faster response time than a second mode; and the second mode in which control of the flow-control valve is to be based on feedback received from the flow controller, the second mode being configured to provide at least one of a higher accuracy and a higher precision than the first mode.

20. The system of claim 15, wherein each of the first self-calibrating flow meter and the second self-calibrating flow meter further include:

a flow-control valve;

a differential-pressure sensor coupled across the respective flow-control valve, the differential-pressure sensor having a first leg coupled upstream of the flow-control valve and a second leg coupled downstream of the flow-control valve; and a temperature sensor coupled proximate to the respective flow-control valve and upstream of the at least one LCV, wherein each of first self-calibrating flow meter and the second self-calibrating flow meter is configured to operate in at least one of two modes that is selected from modes including:

a first mode in which a position of the flow-control valve is to be based on readings from the pressure sensor, at least one of the differential-pressure sensor and the temperature sensor, and calibration data of the flow controller, the first mode being configured to provide a faster response time than a second mode; and the second mode in which control of the flow-control valve is to be based on feedback received from the flow controller, the second mode being configured to provide at least one of a higher accuracy and a higher precision than the first mode.

* * * * *